(12) United States Patent
Nitta et al.

(10) Patent No.: US 11,001,753 B2
(45) Date of Patent: *May 11, 2021

(54) PHOSPHOR THAT INCLUDES CERIUM

(71) Applicant: Panasonic Intellectual Property Management Co., Ltd., Osaka (JP)

(72) Inventors: Mitsuru Nitta, Kyoto (JP); Nobuaki Nagao, Gifu (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 409 days.

This patent is subject to a terminal disclaimer.

(21) Appl. No.: 15/987,213

(22) Filed: May 23, 2018

(65) Prior Publication Data

US 2018/0346808 A1 Dec. 6, 2018

(30) Foreign Application Priority Data

Jun. 6, 2017 (JP) .............................. JP2017-111760

(51) Int. Cl.
*C09K 11/77* (2006.01)
*C09K 11/08* (2006.01)
(Continued)

(52) U.S. Cl.
CPC ...... *C09K 11/7723* (2013.01); *C09K 11/0883* (2013.01); *C09K 11/59* (2013.01);
(Continued)

(58) Field of Classification Search
CPC . C09K 11/0883; C09K 11/59; C09K 11/7721; C09K 11/7774; C09K 11/025;
(Continued)

(56) References Cited

U.S. PATENT DOCUMENTS

| 6,201,262 B1 * | 3/2001 | Edmond | ........... H01L 21/02378 |
| | | | 257/77 |
| 10,214,429 B2 * | 2/2019 | Nitta | ..................... F21S 41/176 |

(Continued)

FOREIGN PATENT DOCUMENTS

| JP | 2006-008721 | 1/2006 |
| JP | 2008-088362 | 4/2008 |

(Continued)

OTHER PUBLICATIONS

Wikipedia page "Color", https://en.wikipedia.org/wiki/Color, printed Aug. 16, 2020, 15 pages (Year: 2020).*

(Continued)

*Primary Examiner* — Matthew E. Hoban
*Assistant Examiner* — Lynne Edmondson
(74) *Attorney, Agent, or Firm* — Renner, Otto, Boisselle & Sklar, LLP

(57) ABSTRACT

A phosphor comprises a crystal phase that has a chemical composition of $(Y_{1-x-y},Ce_x,La_y)_\alpha Si_{\beta-z}Al_z N_\gamma O$, where the $\alpha$ satisfies $5.5 \le \alpha \le 6.5$, the $\beta$ satisfies $9.5 \le \beta \le 12.5$, the $\gamma$ satisfies $17.5 \le \gamma \le 22.5$, the x satisfies $0 < x \le 0.1$, the y satisfies $0 \le y \le 0.4$, and the z satisfies $0 \le z \le 0.5$. A light emission spectrum of the phosphor includes a peak within a wavelength range of not less than 600 nm and not more than 660 nm.

18 Claims, 24 Drawing Sheets

(51) Int. Cl.
  *H01L 33/50* (2010.01)
  *C09K 11/59* (2006.01)
(52) U.S. Cl.
  CPC ........ *C09K 11/7769* (2013.01); *H01L 33/504* (2013.01); *C04B 2235/3229* (2013.01)
(58) Field of Classification Search
  CPC . C09K 11/77; C09K 11/7706; C09K 11/7723; C09K 11/7769; H01L 33/504; H01L 33/502; C04B 2235/3229; C04B 2235/3225; C04B 2235/3865; C04B 35/597; F21Y 2115/30
  See application file for complete search history.

(56) References Cited

U.S. PATENT DOCUMENTS

| | | | |
|---|---|---|---|
| 10,714,661 B2* | 7/2020 | Nitta | ........................ H01L 27/15 |
| 10,717,657 B2* | 7/2020 | Nitta | ........................ G01N 23/20 |
| 2010/0127613 A1 | 5/2010 | Collins et al. | |
| 2012/0175528 A1* | 7/2012 | Haubrich | ................ G01N 21/64 |
| | | | 250/459.1 |
| 2012/0219029 A1* | 8/2012 | Scott | ..................... G01J 3/4406 |
| | | | 372/38.02 |
| 2013/0001470 A1 | 1/2013 | Collins et al. | |
| 2014/0265921 A1* | 9/2014 | Collins | .................. H05B 45/20 |
| | | | 315/297 |

FOREIGN PATENT DOCUMENTS

| | | |
|---|---|---|
| JP | 2012-526910 | 11/2012 |
| JP | 2012-533659 | 12/2012 |
| WO | 2010/132732 A1 | 11/2010 |

OTHER PUBLICATIONS

The Extended European Search Report dated Dec. 6, 2018 for the related European Patent Application No. 18173503.6.

* cited by examiner

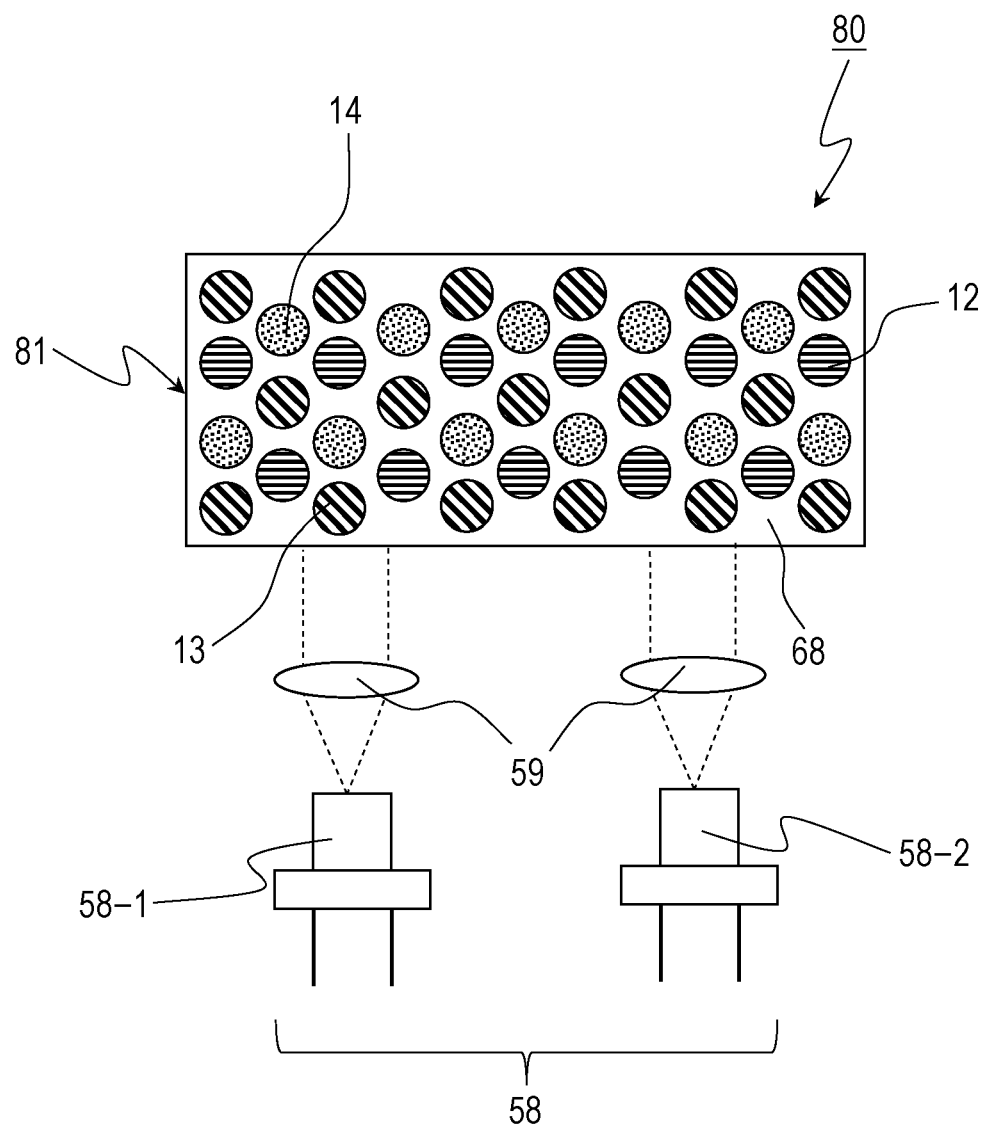

PHOSPHOR THAT INCLUDES CERIUM

BACKGROUND

1. Technical Field

The present disclosure relates to a phosphor that includes Ce.

2. Description of the Related Art

In recent years, solid light sources such as a white light emitting diode (LED) and a laser excitation light source have been widely used. A present common white LED has a configuration in which a blue LED chip as a blue light emitting element and a phosphor are combined. In such a common white LED, color conversion of a portion of light from the blue LED chip is performed by the phosphor, the color of blue light from the blue LED chip and the color of light emission from the phosphor are mixed, and white light is thereby created. In more recent years, development of a high power white light emitting device by a combination of a laser diode (LD) and the phosphor has been performed. As a solid white light source, the combination of the blue LED chip or a blue LD and a yellow phosphor is presently the mainstream. For the purpose of enhancing color rendering, color reproducibility, and so forth or for the purpose of obtaining white with a low color temperature, development of a white light source in which a red phosphor is used in addition to a blue light source and the yellow phosphor has been performed.

In related art, a yellow phosphor that includes Ce as a luminescent center has been known such as the general formula of $Y_3Al_5O_{12}:Ce^{3+}$ (hereinafter abbreviated as YAG:Ce) or the general formula of $La_3Si_6N_{11}:Ce^{3+}$ (hereinafter abbreviated as LSN:Ce) that is disclosed in Japanese Patent No. 4459941. Further, a red phosphor that includes Eu as a luminescent center has been known such as the general formula of $(Sr,Ca)AlSiN_3:Eu^{2+}$ (hereinafter abbreviated as CASN:Eu) that is disclosed in Japanese Patent No. 3837588.

SUMMARY

One non-limiting and exemplary embodiment provides a phosphor that includes Ce as a luminescent center.

In one general aspect, the techniques disclosed here feature a phosphor including a crystal phase that has a chemical composition of $(Y_{1-x-y},Ce_x,La_y)_\alpha Si_{\beta-z}Al_z N_\gamma O$. The $\alpha$ satisfies $5.5 \leq \alpha \leq 6.5$, the $\beta$ satisfies $9.5 \leq \beta \leq 12.5$, the $\gamma$ satisfies $17.5 \leq \gamma \leq 22.5$, the x satisfies $0<x\leq 0.1$, the y satisfies $0 \leq y \leq 0.4$, and the z satisfies $0 \leq z \leq 0.5$. A light emission spectrum of the phosphor includes a peak within a wavelength range of not less than 600 nm and not more than 660 nm.

The present disclosure may realize a phosphor that includes Ce as a luminescent center.

It should be noted that general or specific embodiments may be implemented as a phosphor, an element, a device, a system, a vehicle, a manufacturing method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 8 is a schematic cross-sectional diagram of the LD light emitting device according to a ninth embodiment;

Figure 1:
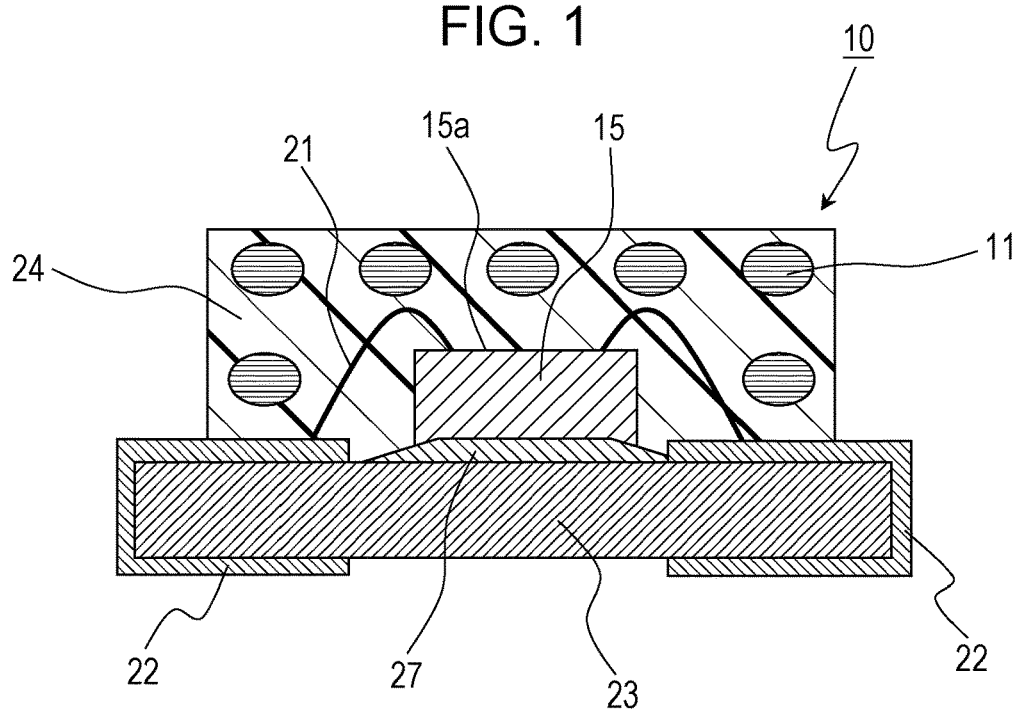
FIG. 1 is a schematic cross-sectional diagram of an LED light emitting device according to a second embodiment.

DETAILED DESCRIPTION (Underlying Knowledge Forming Basis of the Present Disclosure)

A yellow phosphor YAG:Ce has high quantum efficiency of light emission, and the quantum efficiency of light emission hardly changes in a case where the yellow phosphor YAG:Ce is excited by a high power LED or LD. Thus, the yellow phosphor YAG:Ce is installed in almost all while light sources. On the other hand, a red phosphor CASN:Eu has a problem that the quantum efficiency of light emission lowers in a case where the red phosphor CASN:Eu is excited by high power light. Thus, the red phosphor CASN:Eu is installed only in light sources with a comparatively low output. This is because a phosphor that includes Eu as a luminescent center has a long light emission lifetime compared to the phosphor that includes Ce as the luminescent center and is thus subject to luminance saturation in a case of high power excitation. Accordingly, the present inventors have conducted intensive study to obtain a red phosphor that includes Ce as the luminescent center.

(Overview of Aspects According to the Present Disclosure)

A phosphor according to one aspect of the present disclosure includes a crystal phase that has a chemical composition of $(Y_{1-x-y},Ce_x,La_y)_\alpha Si_{\beta-z}Al_z N_\gamma O$. The $\alpha$ satisfies $5.5 \leq \alpha \leq 6.5$, the $\beta$ satisfies $9.5 \leq \beta \leq 12.5$, the $\gamma$ satisfies $17.5 \leq \gamma \leq 22.5$, the x satisfies $0 < x \leq 0.1$, the y satisfies $0 \leq y \leq 0.4$, and the z satisfies $0 \leq z \leq 0.5$. A light emission spectrum of the phosphor includes a peak within a wavelength range of not less than 600 nm and not more than 660 nm.

The first aspect of the present disclosure may realize the phosphor that includes Ce as the luminescent center. Note that the light emission spectrum may have the peak as only one peak or may have plural peaks that include the peak. In a case where the light emission spectrum has plural peaks, the peak may be the maximum peak or may not be the maximum peak.

As for the phosphor of a second aspect, for example, in the phosphor according to the first aspect, an excitation spectrum of the phosphor includes a first peak within a wavelength range of not less than 470 nm and not more than 550 nm.

The phosphor according to the second aspect may realize a longer wavelength of the excitation wavelength. Note that the excitation spectrum may have the first peak as only one peak or may have plural peaks that include the peak. In a case where the excitation spectrum has plural peaks, the first peak may be the maximum peak or may not be the maximum peak.

As for the phosphor of a third aspect, for example, in the phosphor according to the second aspect, the excitation spectrum includes the first peak within a wavelength range of not less than 480 nm and not more than 550 nm.

The phosphor according to the third aspect may realize a still longer wavelength of the excitation wavelength.

As for the phosphor of a fourth aspect, for example, in the phosphor according to at least any one of the first to third aspects, the excitation spectrum further includes a second peak within a wavelength range of not less than 350 nm and less than 470 nm.

The phosphor according to the fourth aspect may be caused to emit light by the excitation light at a shorter wavelength such as 450 nm of a blue LED or 405 nm of a blue-violet LD, for example, and may thus provide a wide choice of excitation light sources.

As for the phosphor of a fifth aspect, for example, in the phosphor according to at least any one of the first to fourth aspects, the y satisfies $0 \leq y \leq 0.3$.

The phosphor according to the fifth aspect may set the peak of the excitation spectrum at 480 nm or more and may realize a phosphor of green excitation.

As for the phosphor of a sixth aspect, for example, in the phosphor according the fifth aspect, the y satisfies $0 \leq y \leq 0.3$.

The phosphor according to the sixth aspect may realize a phosphor whose peak of the excitation spectrum is at 480 nm or more and whose light emission wavelength becomes a longer wavelength.

As for the phosphor of a seventh aspect, for example, in the phosphor according to at least any one of the first to sixth aspects, a 1/e light emission lifetime of the crystal phase is 100 ns or less.

The phosphor according to the seventh aspect has an excellent luminance saturation characteristic and is thus promising as a red phosphor that has high quantum efficiency in high power excitation.

As for the phosphor of an eighth aspect, for example, in the phosphor according to the seventh aspect, the 1/e light emission lifetime of the crystal phase is 50 ns or less.

The phosphor according to the eighth aspect has an excellent luminance saturation characteristic and is thus promising as a red phosphor that has high quantum efficiency in high power excitation.

As for the phosphor of a ninth aspect, for example, in the phosphor according to at least any one of the first to eighth aspects, a full width at half maximum of the peak of the light emission spectrum is 100 nm or more.

The phosphor according to the ninth aspect has the light emission spectrum with a wide wavelength region. Consequently, because the phosphor according to the ninth aspect has a spectrum close to sunlight (that is, natural light), high color rendering may be obtained.

As for the phosphor of a tenth aspect, for example, in the phosphor according to the ninth aspect, the full width at half maximum of the peak of the light emission spectrum is 150 nm or more.

The phosphor according to the tenth aspect has the light emission spectrum with a wide wavelength region. Consequently, because the phosphor according to the tenth aspect has a spectrum close to sunlight (that is, natural light), high color rendering may be obtained.

A light emitting device according to an eleventh aspect of the present disclosure includes: an excitation light source that emits light at a wavelength of 600 nm or less; and a first phosphor that is the phosphor according to at least any one of the first to tenth aspects, which is irradiated with the light emitted by the excitation light source and emits fluorescence at a longer wavelength than the light.

The light emitting device according to the eleventh aspect includes the phosphor according to at least any one of the first to tenth aspects and may thus improve the quantum efficiency in high power excitation more than a light emitting device in related art. In addition, in a case where the light emitting device according to the eleventh aspect is configured as a white light emitting device, high color rendering and color reproducibility may be realized.

As for the light emitting device of a twelfth aspect, for example, in the light emitting device according the eleventh aspect, the light that is emitted by the excitation light source is light at a wavelength of not less than 480 nm and not more than 600 nm.

The light emitting device according to the twelfth aspect may efficiently excite the phosphor.

As for the light emitting device of a thirteenth aspect, for example, in the light emitting device according to the eleventh aspect, the light that is emitted by the excitation light source is light at a wavelength of not less than 420 nm and not more than 480 nm.

The light emitting device according to the thirteenth aspect may use a GaN-based blue LED or blue LD as the excitation light source.

As for the light emitting device of a fourteenth aspect, for example, in the light emitting device according to at least any one of the eleventh to thirteenth aspects, the excitation light source is an LED or an LD.

The fourteenth aspect may realize a high power light emitting device.

For example, in the light emitting device according to at least any one of the eleventh to fourteenth aspects, the light emitting device of a fifteenth aspect further includes a second phosphor that is irradiated with the light which is emitted by the excitation light source and that emits fluorescence at a longer wavelength than the light. A light emission spectrum of the second phosphor may include a peak within a wavelength range of not less than 480 nm and less than 600 nm.

The light emitting device according to the fifteenth aspect includes at least two kinds of phosphors with different light emission wavelengths and may thus control the light emission color.

For example, in the light emitting device according the fifteenth aspect, the light emitting device of a sixteenth aspect further includes a third phosphor that is irradiated with the light which is emitted by the excitation light source and that emits fluorescence at a longer wavelength than the light. The fluorescence of third phosphor may be green light. The fluorescence of second phosphor may be yellow light.

The light emitting device according to the sixteenth aspect includes at least two kinds of phosphors, which are the phosphor which emits yellow light and the phosphor which emits green light, and may thus control the light emission color.

As for the light emitting device of a seventeenth aspect, for example, in the light emitting device according to the eleventh aspect, the excitation light source emits green light and blue light, the green light has a peak wavelength within a wavelength range of not less than 480 nm and not more than 550 nm, and the blue light has a peak wavelength within a wavelength range of not less than 430 nm and not more than 470 nm.

The light emitting device according to the seventeenth aspect is capable of high power light radiation and may realize a light emitting device in which color control is easy.

As for the light emitting device of an eighteenth aspect, for example, in the light emitting device according to the seventeenth aspect, the excitation light source includes: a GaN-based semiconductor laser device that emits the blue light; and a solid YAG:Nd laser device that emits the green light and that includes a second harmonic generator.

The light emitting device according to the eighteenth aspect may realize a high power.

EMBODIMENTS OF THE PRESENT DISCLOSURE

Embodiments of the present disclosure will hereinafter be described in detail. It is matter of course that the present disclosure is not limited to the embodiments but embodiments may be carried out with appropriate modifications within the scope that does not depart the technical scope of the present disclosure.

First Embodiment

In a first embodiment, an embodiment of a phosphor of the present disclosure will be described.

The phosphor of the first embodiment includes a crystal phase that has the chemical composition of $(Y_{1-x-y}, Ce_x, La_y)_\alpha Si_{\beta-z}Al_z N_y O$.

In the above composition formula, x satisfies $0 < x \leq 0.1$. Because Ce has to be included to obtain light emission, x is larger than zero. In view of increasing the light emission intensity, x is desirably 0.0003 or more and more desirably 0.005 or more. The maximum value of x is not restricted as long as the phosphor may emit light. However, in a case where x becomes too large, the light emission intensity lowers due to concentration quenching. Thus, lowering of the light emission intensity may be regulated by setting x to 0.1 or less. Further, in view of increasing the light emission intensity, x is desirably 0.08 or less and more desirably 0.06 or less.

In the above chemical composition of $(Y_{1-x-y}, Ce_x, La_y)_\alpha Si_{\beta-z}Al_z N_y O$ (hereinafter simply referred to as "the above chemical composition"), y satisfies $0 \leq y \leq 0.4$. In a case where y is larger than 0.4, because the substitution amount of Y by La becomes too large, the structure becomes unstable. Further, in a case where y is larger than 0.4, the wavelength of a peak value of a light emission spectrum becomes below 600 nm. Thus, y is set to 0.4 or less.

In view of making a peak of an excitation spectrum of the phosphor a longer wavelength and thereby realizing the phosphor whose peak value of the excitation spectrum is a wavelength of 480 nm or more, for example, y is desirably 0.3 or less. Consequently, y desirably satisfies $0 \leq y \leq 0.3$. Further, in a case that y exceeds zero, the peak value of the light emission spectrum may be further shifted to a long wavelength side. Consequently, y may satisfy $0<y \leq 0.4$. Further, y may satisfy $0<y \leq 0.3$.

In the above chemical composition, z satisfies $0 \leq z \leq 0.5$. In a case where z is larger than 0.5, because the substitution amount of Si by Al becomes too large, the structure becomes unstable.

In the above chemical composition, α satisfies $5.5 \leq \alpha \leq 6.5$ and desirably satisfies $5.8 \leq \alpha \leq 6.2$ or may be $\alpha=6$, for example. In other words, in the above composition formula, α is within a range of $6 \pm 0.5$ and desirably within a range of $6 \pm 0.2$, or α may be 6, for example.

In the above chemical composition, β satisfies $9.5 \leq \beta \leq 12.5$ and desirably satisfies $10.0 \leq \beta \leq 12.0$ or may be $\beta=11$, for example. In other words, in the above composition formula, β is within a range of $11 \pm 1.5$ and desirably within a range of $11 \pm 1.0$, or β may be 11, for example.

In the above chemical composition, γ satisfies $17.5 \leq \gamma \leq 22.5$ and desirably satisfies $18.0 \leq \gamma \leq 22.0$. In other words, in the above composition formula, γ is within a range of $20 \pm 2.5$ and desirably within a range of $20 \pm 2.0$.

The above chemical composition may be $(Y_{1-x-y}Ce_x La_y)_6 Si_{11-z}Al_z N_{20-z/3}O$, for example. Note that the reason why the composition ratio of N is expressed as "20-z/3" is as follows. Because Si is tetravalent and Al is trivalent, in a case where the Si site of z is substituted by Al, charge compensation becomes possible by z/3 deficiency of N. Note that the charge compensation by Al substitution may be possible not by deficiency of N but also by an increase in O.

The phosphor of the first embodiment has a peak of the light emission spectrum within a wavelength range of not less than 600 nm and not more than 660 nm. The phosphor of the first embodiment may have the peak of the light emission spectrum at a wavelength of 605 nm or more or may have the peak of the light emission spectrum at a wavelength of 610 nm or more, for example. The phosphor of the first embodiment may have the peak of the light emission spectrum at a wavelength of 655 nm or less or may have the peak of the light emission spectrum at a wavelength of 650 nm or less, for example.

The phosphor of the first embodiment has a peak of the excitation spectrum within a wavelength range of not less than 470 nm and not more than 550 nm. The phosphor of the first embodiment may have the peak of the excitation spectrum at a wavelength of 480 nm or more or may have the peak of the excitation spectrum at a wavelength of 490 nm or more, for example. The phosphor of the first embodiment may have the peak of the excitation spectrum at a wavelength of 540 nm or less or may have the peak of the excitation spectrum at a wavelength of 530 nm or less, for example.

In a case where the peak of the excitation spectrum within a wavelength range of not less than 470 nm and not more than 550 nm is a first peak of the excitation spectrum, the phosphor of the first embodiment may further have a second peak of the excitation spectrum within a wavelength range of not less than 350 nm and less than 470 nm. The first or second peak of the excitation spectrum may be the maximum peak of the excitation spectrum.

Further, a 1/e light emission lifetime of the phosphor of the first embodiment may exhibit a value of 100 ns or less and possibly exhibits a value of 50 ns or less, for example. The light emission lifetime influences a luminance saturation characteristic. The phosphor that includes Eu such as CASN:Eu as a red phosphor in related art has a long light emission lifetime compared to the phosphor that includes Ce. Thus, the phosphor that includes Eu is subject to the luminance saturation due to lowering of quantum efficiency in a case of high power excitation. Consequently, the phosphor of the first embodiment that includes Ce as a luminescent center is promising as the red phosphor that has higher quantum efficiency even in high power excitation than that of the red phosphor in related art.

In the phosphor of the first embodiment, the full width at half maximum of the peak of the light emission spectrum within a wavelength range of not less than 600 nm and not more than 660 nm may be 100 nm or more or may be 150 nm or more.

The spectrum of light emission from the luminescent center that exhibits light emission by an f-f transition such as $Eu^{3+}$ or $Sm^{3+}$ is linear. This is due to a fact that the $(4f)^n$ shell is not the outermost shell of the ion but 8 electrons of $(5s)^2$ and $(5p)^6$ on the outside of the $(4f)^n$ shell are present and block an influence of a crystal field. On the other hand, the spectrum of light emission from the luminescent center that exhibits light emission by an f-d transition such as $Ce^{3+}$ or $Eu^{2+}$ is broad. This is because electrons in an excited state are (5d) electrons, are present in the outermost shell, and are strongly influenced by the crystal field. In addition, in a case of $Ce^{3+}$, because a ground level $(4f)^1$ is separated to $^2F_{7/2}$ and $^2F_{5/2}$ states due to a spin orbital interaction and electrons are relaxed into the two levels, $Ce^{3+}$ causes light emission with at least two or more peaks. Thus, in general, $Ce^{3+}$ exhibits broader light emission than $Eu^{2+}$. The phosphor of the first embodiment is a phosphor that exhibits such broad light emission, that is, has a wide light emission spectrum. Thus, the light emission spectrum thereof is close to the spectrum of sunlight (that is, natural light). Consequently, the phosphor of the first embodiment may obtain high color rendering.

<Manufacturing Method of Phosphor>

In the following, a description will be made about a manufacturing method of the phosphor of the first embodiment.

As materials, for example, compounds that respectively include Ce, Y, La, Si, and Al may be used, or Ce, Y, La, Si, and Al alone may be used. As the compound, a compound that becomes a nitride by sintering under a nitrogen atmosphere, a high purity (for example, purity of 99% or more) nitride, a metal alloy, or the like may be used. Further, in order to promote a reaction, a small amount of fluoride (for example, ammonium fluoride or the like) may be added.

A Ce compound, a Y compound, an La compound, an Si compound, (or Si alone), and an Al compound (or Al alone) may be prepared such that the chemical composition ratio of $(Y_{1-x-y}Ce_x La_y)_\alpha Si_{\beta-z}Al_z N_\gamma O$, for example, the chemical composition ratio that is expressed by $(Y_{1-x-y}Ce_x La_y)_6 Si_{11-z}Al_z N_{20-z/3}O$ ($0<x \leq 0.1$, $0 \leq y \leq 0.4$, and $0 \leq z \leq 0.5$) is obtained. As specific materials, for example, CeN powder (or $CeO_2$ powder or $CeF_3$ powder), YN powder, LaN powder, $Si_3N_4$ powder, and AlN powder may be used.

Manufacturing of the phosphor of the first embodiment is performed by mixing and sintering the above materials. A mixing method of the materials may be wet mixing in a solution or dry mixing of dry powder. A ball mill, a medium stirring mill, a planetary mill, a vibration mill, a jet mill, a V-type mixer, a stirrer, and so forth, which are usually industrially used, may be used. Sintering is performed in an atmosphere pressurized by nitrogen, in a temperature range of 1500° C. to 2000° C., and for approximately 1 to 50 hours. The pressure in this case is usually 3 atm or more, desirably 4 atm or more, and more desirably 8 atm or more. The sintered fluorescent may be washed in a nitric acid solution at a concentration of 10% for 1 hour, for example. Obtained phosphor powder is again pulverized by using a ball mill, a jet mill, or the like and is further washed or classified as necessary, and the particle size distribution or fluidity of the phosphor powder may thereby be adjusted.

<Light Emitting Device Using Phosphor>

The phosphor of the first embodiment may be used for a light emitting device. A light emitting device in this embodiment includes at least an excitation light source and the phosphor (one example of a first phosphor). The excitation light source emits light at a wavelength of 600 nm or less. The phosphor of the light emitting device of this embodiment is the phosphor of the first embodiment, which is irradiated with the light emitted by the excitation light source and emits fluorescence at a longer wavelength than the light emitted by the excitation light source. In the above configuration, a light emitting device that has high quantum efficiency even in high power excitation may be configured.

Further, the light emitted by excitation light source may be at a wavelength of 480 nm or more to 550 nm or less. The phosphor of the first embodiment typically has the peak of the excitation spectrum within a wavelength range of not less than 470 nm and not more than 550 nm and may thus be excited efficiently. Among the phosphors of the first embodiment, the phosphor that has the peak of the excitation spectrum at a wavelength of 480 nm or more is desirably used. Further, the light emitted by the excitation light source may include light at a wavelength of 200 nm or more to 480 nm or less or may include light at a wavelength of not less than 420 nm and not more than 480 nm. The phosphor of the first embodiment has a wavelength band that absorbs excitation light also at a wavelength of 480 nm or less. Further, because light at a wavelength of 200 nm or less is attenuated by absorption by air, the excitation light source that emits light at a wavelength of 200 nm or more is desirable. Note that as the above excitation light source, for example, an LED or an LD is raised.

Further, the light emitting device in this embodiment may further include a second phosphor that has a peak of the light emission spectrum within a wavelength range of not less than 480 nm and not more than 600 nm. The second phosphor is irradiated with the light emitted by the excitation light source and thereby emits fluorescence at a longer wavelength than the light emitted by the excitation light source. As the second phosphor, a phosphor that includes a crystal phase of the chemical composition of $Y_3Al_5O_{12}$:Ce (YAG:Ce), a phosphor that includes a crystal phase of the chemical composition of $La_3Si_6N_{11}$:Ce (LSN:Ce), or the like may be used.

Further, as the second phosphor, a phosphor that emits yellow light may be used. In addition, a third phosphor that emits green light may be used. The third phosphor is irradiated with the light emitted by the excitation light source and thereby emits fluorescence at a longer wavelength than the light emitted by the excitation light source. As the third phosphor, a phosphor that includes a crystal phase of the chemical composition of $Lu_3Al_5O_{12}$:Ce (LuAG:Ce), a phosphor that includes a crystal phase of the chemical composition of $Y_3(Al,Ga)_5N_{12}$:Ce (YAGG:Ce), or the like may be used. Note that the phosphor of the first embodiment may be excited by using the light emitted by the second phosphor or the third phosphor. Note that the green light is the light that is positioned within a range of (0.1≤x≤0.4, and 0.5≤y≤0.8) in CIE chromaticity coordinate values. Further, the yellow light is the light that is positioned within a range of (0.4≤x≤0.6, and 0.4≤y≤0.6) in the CIE chromaticity coordinate values.

The excitation light source and the second and third phosphors in the light emitting device that includes the phosphor of the first embodiment may freely be selected within the above-described ranges in accordance with the purpose of use of the light emitting device. Consequently, the light emitting device that includes the phosphor of the first embodiment is useful not only as a red light emitting device but also as a white light emitting device or the like. Specifically, the excitation light source that emits blue light, the phosphor that emits yellow light, and the red phosphor of this embodiment are combined, and a high power light emitting device with high color rendering or a high power light emitting device that emits light in an incandescent light color may thereby be realized.

Second Embodiment

As one example of a light emitting device of a second embodiment, a description will be made about an LED light emitting device that includes an LED chip (one example of a light emitting element) as the light source. FIG. 1 is a schematic cross-sectional diagram that illustrates one embodiment of the LED light emitting device according to the second embodiment. As illustrated in FIG. 1, an LED light emitting device 10 includes a phosphor 11, an LED chip (one example of the excitation light source) 15, and an LED sealing body 24. Further, the LED light emitting device 10 may include a support body 23. The support body 23 supports the LED chip 15. In this embodiment, the LED light emitting device 10 includes a structure that is capable of surface mount. Thus, the support body 23 is a substrate. Note that in the LED light emitting device 10, a wavelength conversion element comprises the phosphor 11 and the LED sealing body 24.

This embodiment may be used for a high luminance LED light emitting device. For example, the support body 23 has high thermal conductivity such that the heat that is generated in the LED chip 15 may efficiently be dissipated to the outside. For example, a ceramic substrate that is formed of alumina, aluminum nitride, or the like may be used as the support body 23.

The LED chip 15 emits at least green light. That is, the LED chip 15 has a peak of the light emission spectrum at least within a wavelength range of not less than 480 nm and not more than 550 nm and desirably has the peak of the light emission spectrum within a wavelength range of not less than 510 nm and not more than 540 nm. The LED chip 15 is fixed to the support body 23 by solder 27 or the like such that an emission surface 15a does not become a contact surface with the support body 23. Further, the LED chip 15 is electrically connected with electrodes 22 that are provided to the support body 23 by bonding wires 21. The LED chip 15 is covered by the LED sealing body 24.

For example, a silicone resin is used for the LED sealing body 24. The phosphor 11 is dispersed in the LED sealing body 24. As the silicone resin, silicone resins that are used as sealing resins of semiconductor light emitting elements and have structures provided by various chemical formulas may be used. The silicone resins include dimethyl silicone with high color fastness, for example. Further, methylphenyl silicone or the like with high heat resistance may be used as the silicone resin. The silicone resin may be a homopolymer that has a main skeleton by a siloxane bond which is provided by one kind of chemical formula. Further, the silicone resin may be a copolymer that includes structural units which have siloxane bonds provided by two or more kinds of chemical formulas or an alloy of two or more kinds of silicone polymers.

In this embodiment, the silicone resin in the LED sealing body 24 is in a cured state. Consequently, the LED sealing body 24 is also in a cured state. As described in the following, the LED sealing body 24 may be fabricated by using an uncured silicone resin. The silicone resin is in general a two-liquid type in which a main agent and a curing agent are mixed and curing is thereby promoted. However, the silicone resin of a thermosetting type or an energy-curable type that is cured by irradiation with energy such as light may be used. Note that other materials than the silicone resins may be used for the LED sealing body 24. For example, inorganic materials and so forth that contain glass, epoxy resins, or ZnO may be used. Further, the phosphor 11 may not be dispersed in the LED sealing body 24 but may be arranged on the LED sealing body 24 in a form of a phosphor plate.

In the above-described example, the LED chip is bonded by wire bonding, but the LED chip that is used in this embodiment may be in another configuration. That is, the LED chip that is used in this embodiment may be mounted in a face-up manner or may be mounted in a flip-chip manner. Further, the LED chip that is used in this embodiment may include a light emitting layer that is formed of a nitride semiconductor which has a growth plane of a polar plane (that is, a c-plane).

<Overview of Phosphor>

The phosphor 11 absorbs a portion of wavelength components or all wavelength components of the light emitted from the LED chip 15 and emits fluorescence. The wavelengths of light and the wavelengths of fluorescence that are absorbed are decided in accordance with the kinds of fluorescent materials included in the phosphor 11. The phosphor 11 may be a mixed phosphor that includes plural phosphors with different colors such that white light is created by mixing the colors of light. The phosphor 11 may be a mixed phosphor of a green phosphor and a red phosphor. The red phosphor of the mixed phosphor is the red phosphor which is described in the first embodiment and which includes Ce as the luminescent center.

Examples of the green phosphor include phosphors such as $M^{II}_2MgSi_2O_7:Eu^{2+}$ (where $M^{II}$ is one selected from the group consisting of Ba, Sr, and Ca), $SrSi_5AlO_2N_7:Eu^{2+}$, $SrSi_2O_2N_2:Eu^{2+}$, $BaAl_2O_4:Eu^{2+}$, $BaZrSi_3O_9:Eu^{2+}$, $M^{II}_2SiO_4:Eu^{2+}$ (where $M^{II}$ is one selected from the group consisting of Ba, Sr, and Ca), $BaSi_2O_4N_2:Eu^{2+}$, $Ca_8Mg(SiO_4)_4Cl_2:Eu^{2+}$, $Ca_3SiO_4Cl_2:Eu^{2+}$, and $\beta\text{-SiAlON}:Eu^{2+}$.

As another mode, the phosphor 11 may be a mixed phosphor of a yellow phosphor and a red phosphor. The red phosphor of the mixed phosphor is the red phosphor of the first embodiment. Examples of the yellow phosphor include phosphors such as $Y_3Al_5O_{12}:Ce^{3+}$, $CaSi_2O_2N_2:Eu^{2+}$, $(Ba,Sr)Si_2O_2N_2:Eu^{2+}$, $Ca_3Sc_2Si_3O_{12}:Ce^{3+}$, $CaSc_2O_4:Ce^{3+}$, $\alpha\text{-SiAlON}:Eu^{2+}$, and $La_3Si_6N_{11}:Ce^{3+}$.

Further, the particle diameter of each particle of the phosphor 11 is 1 μm or more to 80 μm or less, for example. Herein, a particle diameter means a diameter that is expressed by an equivalent circle diameter by a microscopic method.

The phosphor 11 is dispersed in the LED sealing body 24 at a ratio of not less than 3 parts by weight and not more than 70 parts by weight, to 100 parts by weight of the sealing body, for example. The content of the phosphor 11 is set to three parts by weight or more, fluorescence with a sufficient intensity may thereby be obtained, and the LED light emitting device 10 that emits light at a desired wavelength may be realized. The weight ratios of the phosphors that are used for the phosphor 11 and that emit light in respective colors may appropriately be decided in response to the desired color tone of light and the light emission intensities of the respective phosphors. Note that the phosphor 11 is set only to the red phosphor of the first embodiment or is combined with the phosphors of other colors, and the LED light emitting device may thereby be configured as the LED light emitting device that emits a desired color.

The above phosphors other than the red phosphor of the first embodiment may be manufactured in accordance with a known method. Specifically, in a case where an oxide phosphor is fabricated, as a material, a compound that becomes an oxide by sintering such as a hydroxide, an oxalate, or a nitrate or an oxide may be used. Here, in order to promote a reaction, a small amount of fluoride (for example, calcium fluoride or the like) or chloride (for example, calcium chloride or the like) may be added. Manufacturing of the phosphor is performed by mixing and sintering the above materials.

As the mixing method of the materials, wet mixing in a solution or dry mixing of dry powder may be used. A ball mill, a medium stirring mill, a planetary mill, a vibration mill, a jet mill, a V-type mixer, a stirrer, and so forth, which are usually industrially used, may be used. Sintering of the materials of the phosphors is performed in the air or under a reducing atmosphere, in a temperature range of 1100° C. to 1700° C., and for approximately 1 to 50 hours. As a furnace that is used for sintering, a furnace that is usually industrially used may be used. For example, a continuous-type or batch-type electric furnace or gas furnace such as a pusher furnace or a pressurized sintering furnace such as plasma sintering (SPS) or hot isotonic pressure sintering (HIP) may be used. Obtained phosphor powder is again pulverized by using a ball mill, a jet mill, or the like and is further washed or classified as necessary, and the particle size distribution or fluidity of the phosphor powder may thereby be adjusted.

As described above, the light emitting device according to the second embodiment uses the excitation light source, which emits green light, and the red phosphor, which includes Ce as the luminescent center. This configuration is not provided to a light emitting device in related art. This configuration enables the light emitting device of the second embodiment to realize a high efficiency light source.

Third Embodiment

Figure 2:
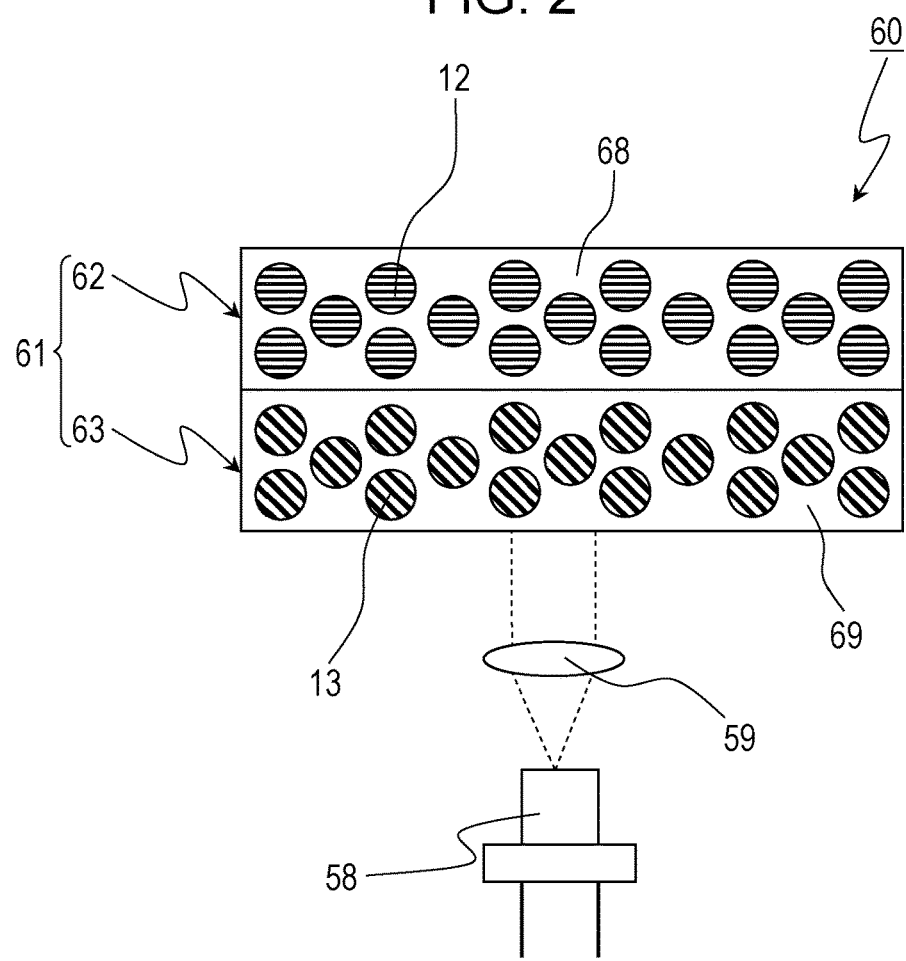
FIG. 2 is a schematic cross-sectional diagram of an LD light emitting device according to a third embodiment.

In a third embodiment, as one example of a light emitting device of the present disclosure, a description will be made about an LD light emitting device that includes an LD (one example of the light emitting element) as the light source. FIG. 2 illustrates an outline configuration of an LD light emitting device 60 according to the third embodiment. The LD light emitting device 60 includes an LD element (one example of the excitation light source) 58 and a wavelength conversion member (one example of a wavelength conversion element) 61. The wavelength conversion member 61 includes the phosphor. The phosphor performs wavelength conversion from the light emitted from the LD element 58 into light at a longer wavelength.

The LD element 58 may emit light with a higher light power density than an LED. Thus, a high power LD light emitting device 60 may be configured by using the LD element 58. The light power density of the light from the LD element 58, with which the phosphor is irradiated, is 0.5 W/mm$^2$ or more, for example, in view of a higher output of the LD light emitting device 60. Further, the light power density of the light, with which the phosphor is irradiated, may be 2 W/mm$^2$ or more, may be 3 W/mm$^2$ or more, or may be 10 W/mm$^2$ or more. On the other hand, in a case where the light power density of the light, with which the phosphor is irradiated, is too high, the heat generation amount from the phosphor increases, and this may adversely influence the LD light emitting device 60. Thus, the light power density of the light, with which the phosphor is irradiated, may be 150 W/mm$^2$ or less, may be 100 W/mm$^2$ or less, may be 50 W/mm$^2$ or less, or may be 20 W/mm$^2$ or less.

An LD element that emits green light may be used for the LD element 58. That is, for the LD element 58, an LD element that has a peak of the light emission spectrum at least within a wavelength range of not less than 480 nm and not more than 550 nm or an LD element that desirably has the peak of the light emission spectrum within a wavelength range of not less than 510 nm and not more than 540 nm are used.

The LD element 58 may be configured with one LD or may be configured with plural LDs that are optically coupled together. The LD element 58 may include a light emitting layer that is formed of a nitride semiconductor which has a growth plane as a non-polar plane or a semi-polar plane, for example.

The phosphor of the wavelength conversion member 61 includes the red phosphor that includes Ce as the luminescent center. Because the red phosphor that includes Ce as the luminescent center is described in the first embodiment, a detailed description will not be made here. The wavelength conversion member 61 may further include a phosphor other than the red phosphor that includes Ce as the luminescent center, in accordance with the desired light emission color of the light emitting device. For example, the wavelength conversion member 61 may further include a yellow phosphor and a green phosphor. As the yellow phosphor and the green phosphor, the phosphors that are exemplified in the second embodiment may be used. The wavelength conversion member 61 may be a single wavelength conversion layer in which plural kinds of phosphors are mixed or may be two or more wavelength conversion layers each of which includes a single kind or plural kinds of phosphors. In this embodiment, a description will be made particularly about a case where the wavelength conversion member 61 has a configuration in which a first phosphor layer 62 containing a red phosphor 12 including Ce as the luminescent center and a second phosphor layer 63 containing a yellow phosphor 13 are laminated.

The first phosphor layer 62 and the second phosphor layer 63 are respectively configured by using binders 68 and 69. The binders 68 and 69 are media such as a resin, glass, or a transparent crystal, for example. The binders 68 and 69 may be formed of the same material or of different materials. Note that each of the phosphor layers may be configured only with phosphor particles.

An incidence optical system 59 that leads light of the LD element 58 to the second phosphor layer 63 may be provided between the wavelength conversion member 61 and the LD element 58. The incidence optical system 59 may include a lens, a mirror, an optical fiber, or the like, for example.

Next, an action of the LD light emitting device 60 of this embodiment will be described. The green light that is emitted from the LD element 58 passes through the incidence optical system 59 and is incident on the second phosphor layer 63 of the wavelength conversion member 61. The yellow phosphor 13 of the second phosphor layer 63 is excited by this incident light and emits yellow light. Further, the green light emitted from the LD element 58, which is not absorbed by the second phosphor layer 63 but penetrates that, is incident on the first phosphor layer 62. The red phosphor 12 of the first phosphor layer 62 is excited by this incidence and emits red light. Further, the yellow light that is radiated from the second phosphor layer 63 is incident on the first phosphor layer 62. The red phosphor 12 of the first phosphor layer 62 may be excited by a portion of this incident light and may emit red light. Further, the green light emitted from the LD element 58, which is not absorbed by the first phosphor layer 62 or the second phosphor layer 63 but penetrates those, is radiated to the outside. The light in which the red light, yellow light, and green light are mixed is radiated from the LD light emitting device 60.

Note that the thickness of each of the phosphor layers may be adjusted such that the green light emitted from the LD element 58 does not penetrate the first phosphor layer 62. Further, the thickness of each of the phosphor layers may be adjusted such that the yellow light radiated from the second phosphor layer 63 does not penetrate the first phosphor layer 62. In a case where the green light and yellow light do not penetrate the first phosphor layer 62, only the red light is radiated to the outside. As another mode, the green phosphor that is described in the second embodiment may be used instead of the yellow phosphor 13 that is used for the second phosphor layer 63.

As described above, the light emitting device according to the third embodiment uses the excitation light source, which emits green light, and the red phosphor, which includes Ce as the luminescent center. This configuration is not provided to a light emitting device in related art. This configuration enables the light emitting device of the third embodiment to realize a high efficiency light source.

Fourth Embodiment

Figure 3:
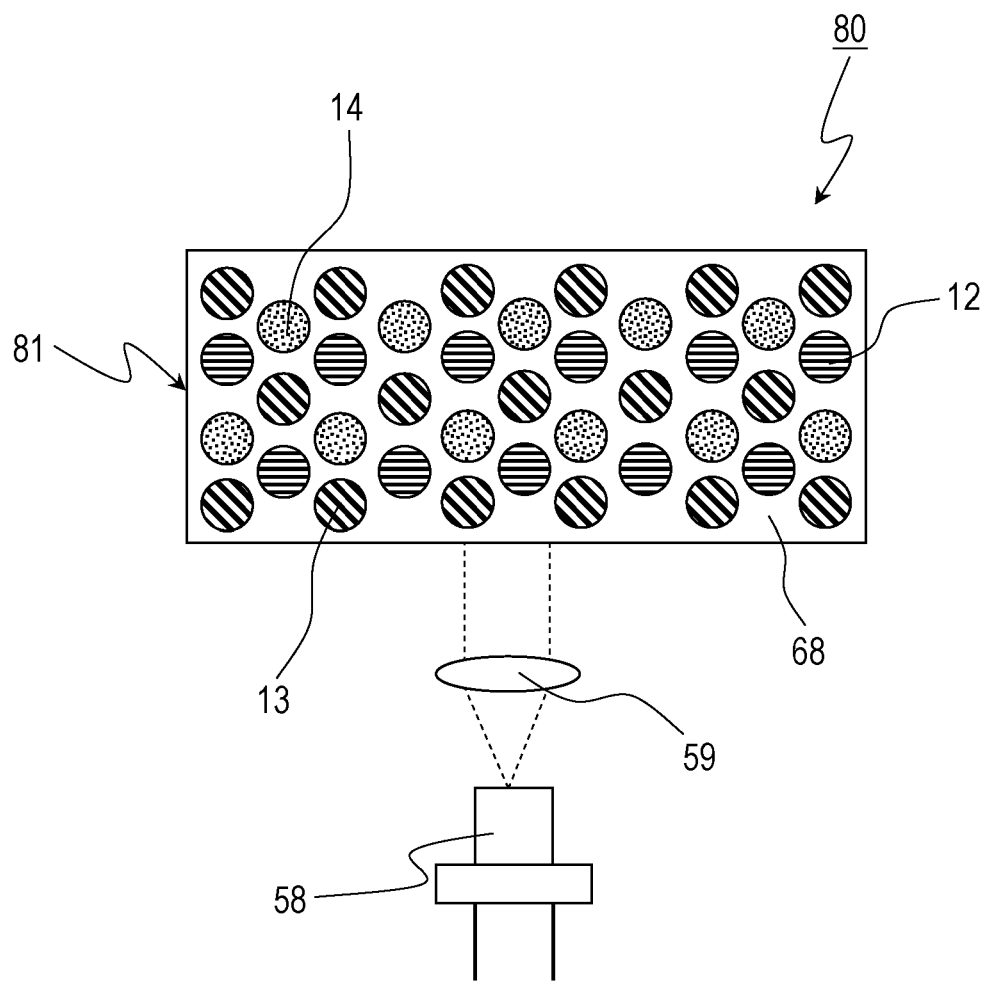
FIG. 3 is a schematic cross-sectional diagram of an LD light emitting device according to a fourth embodiment.

In a fourth embodiment, as one example of a light emitting device of the present disclosure, a description will be made about an LD light emitting device that includes an LD (one example of the light emitting element) as the light source. FIG. 3 illustrates an outline configuration of an LD light emitting device 80 according to the fourth embodiment. The same members as the third embodiment are provided with the same reference numerals, and a detailed description thereof may not be made. The LD light emitting device 80 includes the LD element 58 and a wavelength conversion member 81.

The wavelength conversion member 81 includes a phosphor. The phosphor performs wavelength conversion from the light emitted from the LD element 58 into light at a longer wavelength. The phosphor of the wavelength conversion member 81 has a wavelength conversion layer in which the red phosphor 12 is mixed with at least one kind selected from the group consisting of the yellow phosphor 13 and a green phosphor 14. As the red phosphor 12, the red phosphor that includes Ce as the luminescent center is used. Because the red phosphor that includes Ce as the luminescent center is described in the first embodiment, a detailed description will not be made here. As the yellow phosphor and the green phosphor, the phosphors that are exemplified in the second embodiment may be used. In this embodiment, a description will be made particularly about a case where the wavelength conversion member 81 is a phosphor layer that is formed by mixing three kinds of phosphors which are the red phosphor 12, the yellow phosphor 13, and the green phosphor 14. It is possible to appropriately adjust the mixing ratio of the three kinds of phosphors in response to the desired color tone of light, the light emission intensities of the respective phosphors, and so forth.

The phosphor layer as the wavelength conversion member 81 is configured by using the binder 68. The binder 68 is a medium such as a resin, glass, or a transparent crystal, for example. The binder 68 may be formed of a single material or may be formed of a different material in accordance with the place. Note that the phosphor layer may be configured only with phosphor particles.

The green light that is emitted from the LD element 58 passes through the incidence optical system 59 and is converted into red light, yellow light, and green light respectively by the red phosphor 12, the yellow phosphor 13, and the green phosphor 14 in the wavelength conversion member 81. The light that results from mixing of the green light emitted from the LD element 58, which is not absorbed by the phosphors, and the red light, the yellow light, and the green light, which are respectively converted by the red phosphor 12, the yellow phosphor 13, and the green phosphor 14, is radiated from the LD light emitting device 80. Note that the red phosphor 12 may be excited by the incidence of a portion of the green light emitted from the green phosphor 14 and may emit red light.

As described above, the light emitting device according to the fourth embodiment uses the excitation light source, which emits green light, and the red phosphor, which includes Ce as the luminescent center. This configuration is not provided to a light emitting device in related art. This configuration enables the light emitting device of the fourth embodiment to realize a high efficiency light source.

Fifth Embodiment

A light emitting device in a fifth embodiment includes an excitation light source and a wavelength conversion element that performs wavelength conversion of the light emitted from the excitation light source.

The excitation light source emits green light and further emits blue light. A peak wavelength of green light is in a range of 480 nm or more to 550 nm or less and desirably in a range of 510 nm or more to 540 nm or less. A peak wavelength of blue light may be a wavelength of not less than 430 nm and not more than 470 nm.

Note that as the above excitation light source, for example, an LED or an LD is raised. The excitation light source may be a GaN-based LED or LD and is desirably a GaN-based LD. Further, the excitation light source may include: a GaN-based semiconductor laser device that emits blue light; and a solid YAG:Nd laser device that emits green light and that includes a second harmonic generator.

The wavelength conversion element includes at least the red phosphor that includes Ce as the luminescent center. Because the red phosphor that includes Ce as the luminescent center is described in the first embodiment, a detailed description will not be made here.

In the above configuration, a light emitting device, which has high quantum efficiency even in high power excitation, may be configured.

In a case where the red phosphor that includes Ce as the luminescent center is used as a first phosphor, the wavelength conversion element in this embodiment may further include a second phosphor that has a light emission peak wavelength within a wavelength range of not less than 500 nm and not more than 600 nm. The second phosphor is irradiated with the light emitted by a blue excitation light source and thereby emits fluorescence at a longer wavelength than the light emitted by the blue excitation light source. As the second phosphor, a phosphor that includes a crystal phase of the chemical composition of $Y_3Al_5O_{12}$:Ce (YAG:Ce), a phosphor that includes a crystal phase of the chemical composition of $La_3Si_6N_{11}$:Ce (LSN:Ce), or the like may be used.

Further, the second phosphor may be a phosphor that emits yellow light and may be used in combination with a third phosphor that emits green light. That is, the wavelength conversion element in this embodiment may further include the third phosphor that emits green light in addition to the red phosphor that includes Ce as the luminescent center and the second phosphor that emits yellow light. The third phosphor is irradiated with the light emitted by the excitation light source and thereby emits fluorescence at a longer wavelength than the light emitted by the excitation light source. As the third phosphor, a phosphor that includes a crystal phase of the chemical composition of $Lu_3Al_5O_{12}$:Ce (LuAG:Ce), a phosphor that includes a crystal phase of the chemical composition of $Y_3(Al,Ga)_5N_{12}$:Ce (YAGG:Ce), or the like may be used.

Note that the red phosphor that includes Ce as the luminescent center may be excited by using the light emitted by the second phosphor or the third phosphor.

Further, the third green phosphor may be used instead of the second yellow phosphor. That is, the wavelength conversion element in this embodiment may further include the third phosphor that emits green light in addition to the red phosphor that includes Ce as the luminescent center.

In the light emitting device of this embodiment, the excitation light source, the red phosphor, and the second and third phosphors may freely be selected within the above-described range in accordance with the purpose of use of the light emitting device.

Further, the 1/e light emission lifetimes of all the phosphors that are included in the wavelength conversion element of this embodiment may exhibit a value of 100 ns or less. The light emission lifetime influences the luminance saturation characteristic. The phosphor that includes Eu such as CASN:Eu as a red phosphor in related art has a long light emission lifetime compared to the phosphor that includes Ce. Thus, the phosphor that includes Eu is subject to the luminance saturation due to lowering of the quantum efficiency in a case of high power excitation. Consequently, the red phosphor that includes Ce as the luminescent center is promising as the red phosphor that has higher quantum efficiency in high power excitation than that of the red phosphor in related art.

As described above, the light emitting device according to this embodiment uses the excitation light source, which emits green light and blue light, and the red phosphor, which includes Ce as the luminescent center. This configuration is not provided to a light emitting device in related art. This configuration enables the light emitting device of this embodiment to realize a high power light emitting device with high color rendering or a high power light emitting device that emits light in the incandescent light color.

Sixth Embodiment

In a sixth embodiment, as one example of a light emitting device of the present disclosure, a description will be made about an LED light emitting device that includes an LED chip (one example of the light emitting element) as the light source.

Figure 4:
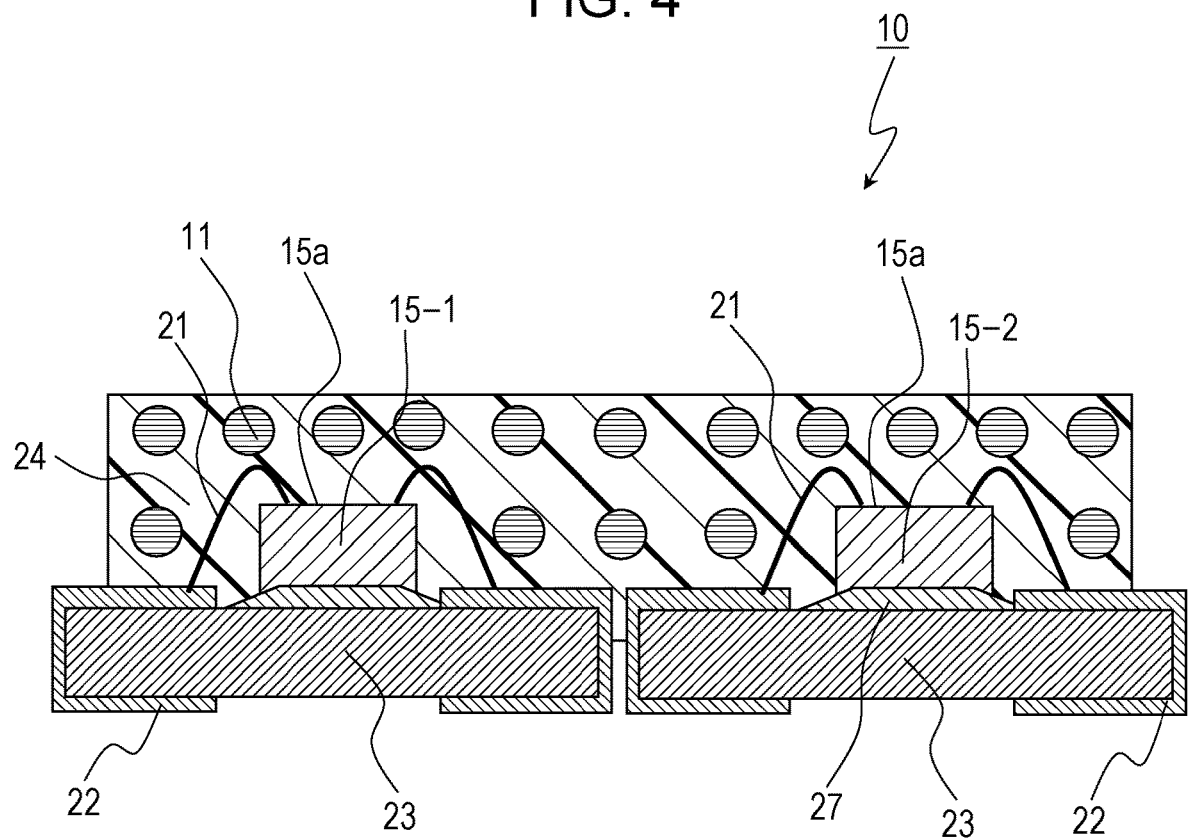
FIG. 4 is a schematic cross-sectional diagram of the LED light emitting device according to a sixth embodiment.

FIG. 4 is a schematic cross-sectional diagram that illustrates one embodiment of the LED light emitting device according to the sixth embodiment. As illustrated in FIG. 4, the LED light emitting device 10 includes the phosphor 11, an LED chip 15-1, an LED chip 15-2, and the LED sealing body 24. Further, the LED light emitting device 10 may include the support body 23. The support body 23 supports the LED chip 15. In this embodiment, the LED light emitting device 10 includes a structure that is capable of surface mount. Thus, the support body 23 is a substrate. Note that in this embodiment, the LED chip 15 indicates both of the LED chip 15-1 and the LED chip 15-2.

This embodiment may be used for a high luminance LED light emitting device. For example, the support body 23 has high thermal conductivity such that the heat that is generated in the LED chip 15 may efficiently be dissipated to the outside. For example, a ceramic substrate that is formed of alumina, aluminum nitride, or the like may be used as the support body 23.

The LED chip 15-1 emits light in a blue region. The LED chip 15-1 has a peak of the light emission spectrum within a wavelength range of not less than 430 nm and not more than 470 nm, for example. Specifically, as the LED chip 15-1, a blue LED chip is used.

The LED chip 15-2 emits light in a green region. The LED chip 15-2 has the peak of the light emission spectrum within a wavelength range of not less than 480 nm and not more than 550 nm and desirably has the peak of the light emission spectrum within a wavelength range of not less than 510 nm and not more than 540 nm. Specifically, as the LED chip 15-2, a green LED chip is used.

The LED chip 15 is fixed to the support body 23 by the solder 27 or the like such that the emission surface 15a does not become a contact surface with the support body 23 on the support body 23. Further, the LED chip 15 is electrically connected with electrodes 22 that are provided to the support body 23 by the bonding wires 21. The LED chip 15 is covered by the LED sealing body 24.

A silicone resin is used for the LED sealing body 24. The phosphor 11 is dispersed in the LED sealing body 24. For the silicone resin, silicone resins that are used as sealing resins of semiconductor light emitting elements and have structures provided by various chemical formulas may be used. The silicone resins include dimethyl silicone with high color fastness, for example. Further, methylphenyl silicone or the like with high heat resistance may be used as the silicone resin. The silicone resin may be a homopolymer that has a main skeleton by a siloxane bond which is provided by one kind of chemical formula. Further, the silicone resin may be a copolymer that includes structural units which have siloxane bonds provided by two or more kinds of chemical formulas or an alloy of two or more kinds of silicone polymers.

In this embodiment, the silicone resin in the LED sealing body 24 is in a cured state. Consequently, the LED sealing body 24 is also in a cured state. As described in the following, the LED sealing body 24 may be fabricated by using an uncured silicone resin. The silicone resin is in general a two-liquid type in which a main agent and a curing agent are mixed and curing is thereby promoted. However, the silicone resin of a thermosetting type or an energy-curable type that is cured by irradiation with energy such as light may be used. Note that other materials than the silicone resins may be used for the LED sealing body 24. For example, inorganic materials that contain glass, epoxy resins or the like, or ZnO may be used. Further, the phosphor 11 may not be dispersed in the LED sealing body 24 but may be arranged on the LED sealing body 24 in a form of a phosphor plate.

In the above-described example, the LED chip is bonded by wire bonding, but the LED chip that is used in this embodiment may be in another configuration. That is, the LED chip that is used in this embodiment may be mounted in a face-up manner or may be mounted in a flip-chip manner. Further, the LED chip that is used in this embodiment may include a light emitting layer that is formed of a nitride semiconductor which has a growth plane of a polar plane (that is, the c-plane).

<Overview of Phosphor>

The phosphor 11 absorbs a portion of wavelength components or all wavelength components of the light in the blue region, which is emitted from the LED chip 15-1, and the light in the green region, which is emitted from the LED chip 15-2, and emits fluorescence. The wavelengths of light and the wavelengths of fluorescence that are absorbed are decided in accordance with the kinds of fluorescent materials included in the phosphor 11. The phosphor 11 may be a mixed phosphor that includes plural phosphors with different colors such that white light is created by mixing the colors of light. The phosphor 11 may be a mixed phosphor of a green phosphor and a red phosphor. The phosphor of the mixed phosphor is the red phosphor that is described in the first embodiment and that includes Ce as the luminescent center.

As the green phosphor, for example, a phosphor such as $Lu_3Al_5O_{12}$:Ce, $Y_3(Al,Ga)_5N_{12}$:Ce, or the like may be used.

As another mode, the phosphor 11 may be a mixed phosphor of a yellow phosphor and a red phosphor. As the yellow phosphor, for example, a phosphor such as $Y_3Al_5O_{12}$:Ce (YAG:Ce), $La_3Si_6N_{11}$:Ce, or the like may be used.

Further, the particle diameter of each particle of the phosphor 11 is 1 μm or more to 80 μm or less, for example. Herein, a particle diameter means a diameter that is expressed by an equivalent circle diameter by a microscopic method.

The phosphor 11 is dispersed in the LED sealing body 24 at a ratio of not less than 3 parts by weight and not more than 70 parts by weight, to 100 parts by weight of the sealing body, for example. In a case where the content of the phosphor 11 is three parts by weight or more, fluorescence with a sufficient intensity may be obtained, and the LED light emitting device 10 that emits light at a desired wavelength may be realized. The weight ratios of the phosphors that are used for the phosphor 11 and that emit light in respective colors may appropriately be decided in response to the desired color tone of white light and the light emission intensities of the respective phosphors. Note that the phosphor 11 may include only the red phosphor of the first embodiment, or may include the red phosphor and one or more phosphors of other colors. The LED light emitting device may thereby also be configured as the LED light emitting device that emits another color than white.

In the light emitting device of the sixth embodiment, the red phosphor that includes Ce as the luminescent center is used, and the red phosphor is excited by green light with high absorption efficiency. Thus, the quantum efficiency may be improved more than related art. In addition, in a case where the light emitting device of the sixth embodiment is configured as a white light emitting device, high color rendering and color reproducibility may be realized.

Seventh Embodiment

Figure 5:
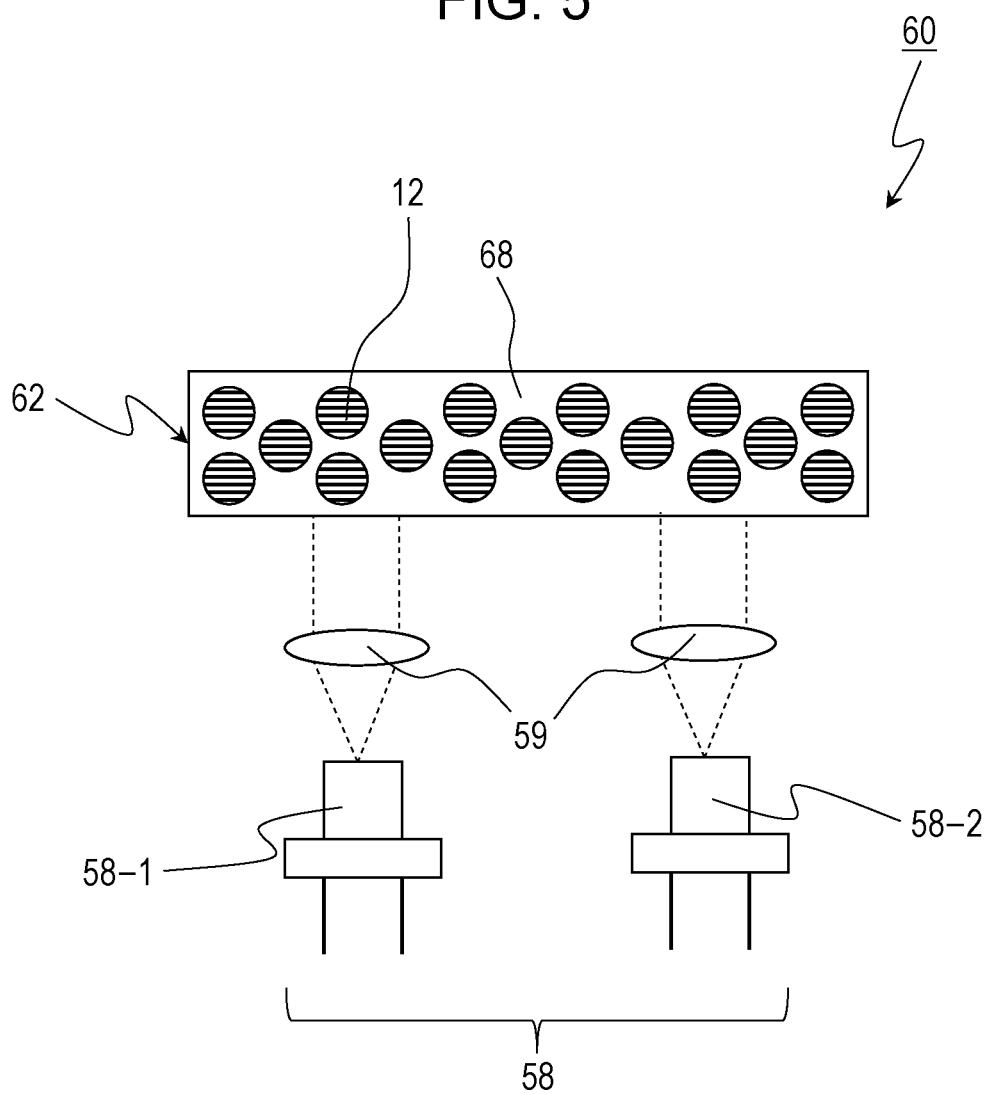
FIG. 5 is a schematic cross-sectional diagram of the LD light emitting device according to a seventh embodiment.

In a seventh embodiment, as one example of a light emitting device of the present disclosure, a description will be made about an LD light emitting device that includes an LD (one example of the light emitting element) as the light source. FIG. 5 illustrates an outline configuration of the LD light emitting device 60 according to the seventh embodiment. The LD light emitting device 60 includes an LD element (one example of the excitation light source) 58-1, an LD element (one example of the excitation light source) 58-2, and the phosphor layer 62 as the wavelength conversion member (one example of the wavelength conversion element). The LD element 58-1 is an LD that emits blue light. The LD element 58-2 is an LD that emits green light. The phosphor layer 62 includes the phosphor. The phosphor performs wavelength conversion from the light emitted from the LD element 58 into light at a longer wavelength. Note that in this embodiment, the LD element 58 indicates both of the LD element 58-1 and the LD element 58-2.

The LD element 58 may emit light with a higher light power density than an LED. Thus, a high power LD light emitting device 60 may be configured by using the LD element 58. The light power density of the light from the LD element 58, with which the phosphor is irradiated, is 0.5 W/mm$^2$ or more, for example, in view of a higher output of the LD light emitting device 60. Further, the light power density of the light, with which the phosphor is irradiated, may be 2 W/mm$^2$ or more, may be 3 W/mm$^2$ or more, or may be 10 W/mm$^2$ or more. On the other hand, in a case where the light power density of the light, with which the phosphor is irradiated, is too high, the heat generation amount from the phosphor increases, and this may adversely influence the LD light emitting device 60. Thus, the light power density of the light, with which the phosphor is irradiated, may be 150 W/mm$^2$ or less, may be 100 W/mm$^2$ or less, may be 50 W/mm$^2$ or less, or may be 20 W/mm$^2$ or less.

The LD element 58-1 emits light in the blue region. The LD element 58-1 has a peak of the light emission spectrum within a wavelength range of not less than 430 nm and not more than 470 nm. Specifically, as the LD element 58-1, an LD element that emits blue light is used. As the LD element 58-1, a GaN-based semiconductor laser device, that is, a GaN-based LD may be used.

The LD element 58-2 emits light in the green region. The LD element 58-2 has the peak of the light emission spectrum within a wavelength range of not less than 480 nm and not more than 550 nm and desirably has the peak of the light emission spectrum within a wavelength range of not less than 510 nm and not more than 540 nm. Specifically, as the LD element 58-2, an LD element that emits green light is used. As the LD element 58-2, a GaN-based semiconductor laser device, that is, a GaN-based LD may be used. As the LD element 58-2, a solid YAG:Nd laser device that includes a second harmonic generator may be used.

The LD element 58 may include the light emitting layer that is formed of a nitride semiconductor which has a growth plane as a non-polar plane or a semi-polar plane, for example.

The phosphor layer 62 as the wavelength conversion member includes the red phosphor 12 that includes Ce as the luminescent center. Because the red phosphor that includes Ce as the luminescent center is described in the first embodiment, a detailed description will not be made here.

The phosphor layer 62 is configured by using the binder 68. The binder 68 is a medium such as a resin, glass, or a transparent crystal, for example. Note that the phosphor layer 62 may be configured only with phosphor particles.

The incidence optical system 59 that leads light of the LD element 58 to the phosphor layer 62 may be provided between the phosphor layer 62 and the LD element 58-1 and between the phosphor layer 62 and the LD element 58-2. The incidence optical system 59 may include a lens, a mirror, an optical fiber, or the like, for example.

Next, an action of the LD light emitting device 60 of this embodiment will be described. The blue light that is emitted from the LD element 58-1 passes through the incidence optical system 59 and is incident on the phosphor layer 62. The red phosphor 12 of the phosphor layer 62 is excited by this incident light and emits red light. Further, the blue light emitted from the LD element 58-1, which is not absorbed by the phosphor layer 62 but penetrates that, is radiated to the outside.

The green light that is emitted from the LD element 58-2 passes through the incidence optical system 59 and is incident on the phosphor layer 62. The red phosphor 12 of the phosphor layer 62 is excited by this incident light and emits red light. Further, the green light emitted from the LD element 58-2, which is not absorbed by the phosphor layer 62 but penetrates that, is radiated to the outside.

The above red light, green light, and blue light that are radiated from the phosphor layer 62 to the outside are mixed and thereby become white light.

Note that the thickness of the phosphor layer 62 may be adjusted such that the blue light emitted from the LD element 58-1 and the green light emitted from the LD element 58-2 do not penetrate the phosphor layer 62. In this case, only the red light is radiated to the outside.

Next, modification examples of the LD light emitting device 60 of this embodiment will be described with reference to FIG. 6A to FIG. 6I. Note that in the following description, the configuration of the LD light emitting device 60, which is illustrated in FIG. 5, may be referred to as basic configuration.

Figure 6A:
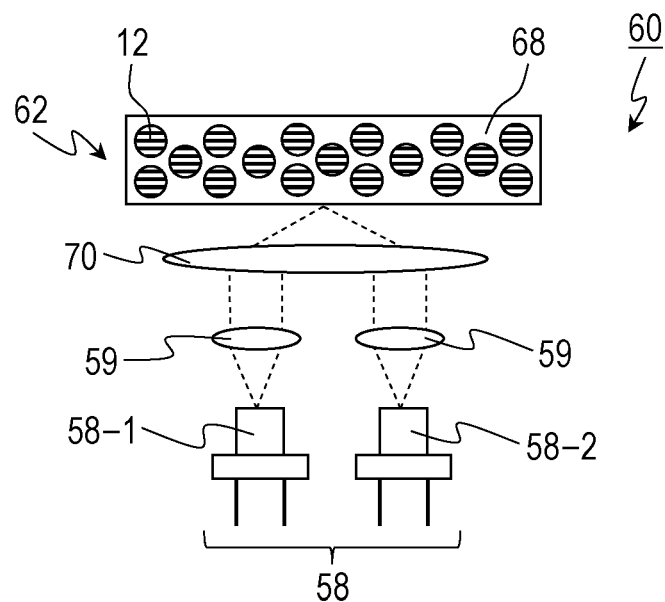
FIG. 6A is a schematic cross-sectional diagram of a first modification example of the LD light emitting device according to the seventh embodiment.

FIG. 6A illustrates an outline configuration of a first modification example of the LD light emitting device 60 of this embodiment. In the LD light emitting device 60 of the first modification example, a light collecting lens 70 is provided between the incidence optical systems 59 and the phosphor layer 62. The light collecting lens 70 collects the blue light and the green light that are emitted from the incidence optical system 59 to one point and causes the phosphor layer 62 to be irradiated with the collected light. The other configurations of the first modification example are the same as the basic configuration.

Figure 6B:
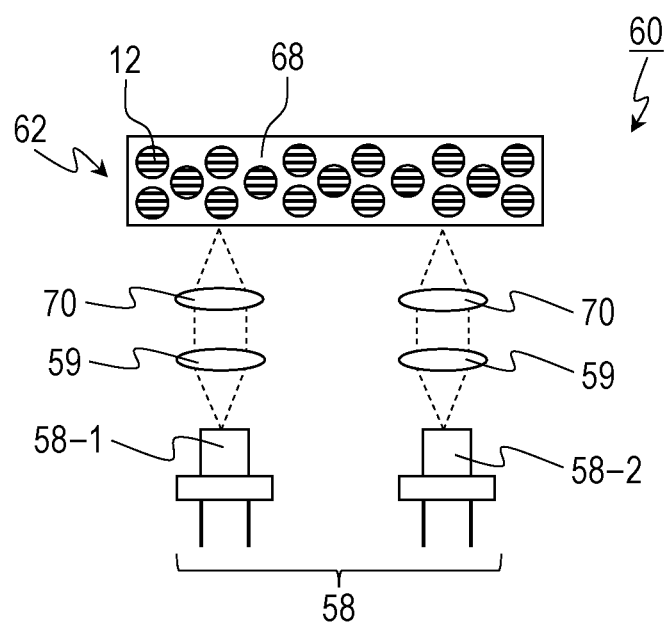
FIG. 6B is a schematic cross-sectional diagram of a second modification example of the LD light emitting device according to the seventh embodiment.

FIG. 6B illustrates an outline configuration of a second modification example of the LD light emitting device 60 of this embodiment. In the LD light emitting device 60 of the second modification example, the light collecting lens 70 is provided between the incidence optical system 59 provided for the LD element 58-1 and the phosphor layer 62. The light collecting lens 70 collects the blue light emitted from the incidence optical system 59 to one point and causes the phosphor layer 62 to be irradiated with the collected light. In addition, in the LD light emitting device 60 of the second modification example, the light collecting lens 70 is provided between the incidence optical system 59 provided for the LD element 58-2 and the phosphor layer 62. The light collecting lens 70 collects the green light emitted from the incidence optical system 59 to one point and causes the phosphor layer 62 to be irradiated with the collected light. The other configurations of the second modification example are the same as the basic configuration.

Figure 6C:
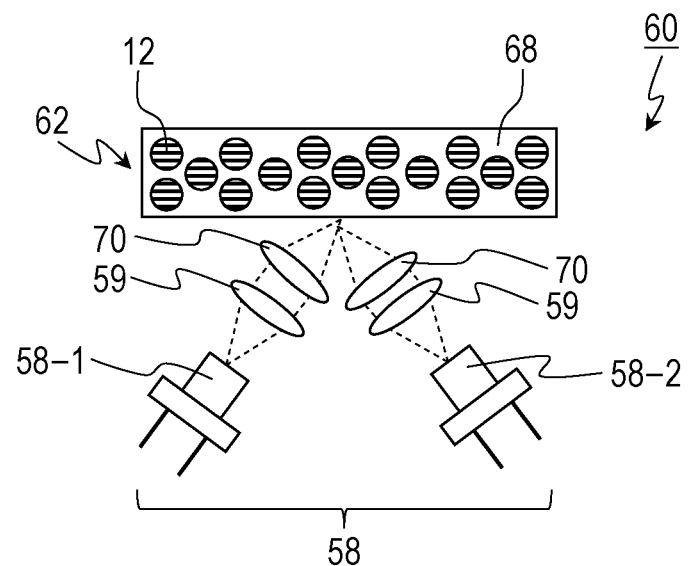
FIG. 6C is a schematic cross-sectional diagram of a third modification example of the LD light emitting device according to the seventh embodiment.

FIG. 6C illustrates an outline configuration of a third modification example of the LD light emitting device 60 of this embodiment. The LD light emitting device 60 of the third modification example has a configuration in which the configuration of the second modification example is further modified. As for the LD light emitting device 60 of the third modification example, in the configuration of the second modification example, each of the LD element 58-1 and the LD element 58-2 is arranged in a state where each of those is inclined to an irradiation surface of the phosphor layer 62. In this configuration, irradiated regions of the phosphor layer 62 with the blue light and the green light may be aligned.

Figure 6D:
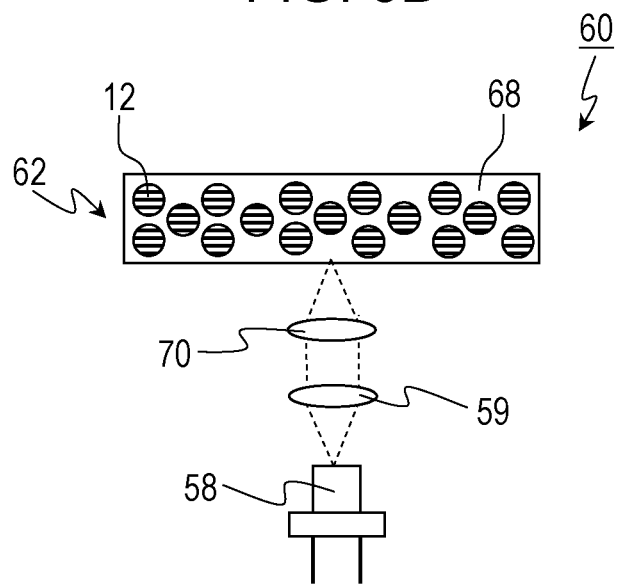
FIG. 6D is a schematic cross-sectional diagram of a fourth modification example of the LD light emitting device according to the seventh embodiment.

FIG. 6D illustrates an outline configuration of a fourth modification example of the LD light emitting device 60 of this embodiment. The LD light emitting device 60 of the fourth modification example has a configuration in which both of a blue LD and a green LD are installed in one LD element 58. The other configurations of the fourth modification example are the same as the basic configuration. This configuration enables one LD element to emit green light and blue light and enables size reduction of the light emitting device, for example.

Figure 6E:
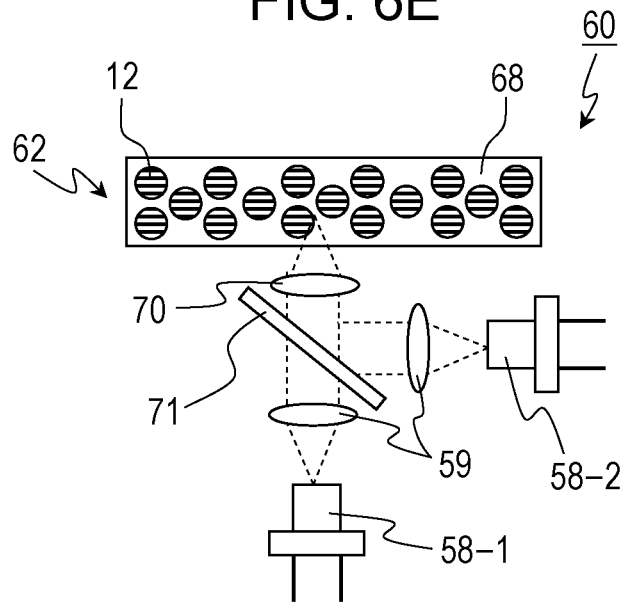
FIG. 6E is a schematic cross-sectional diagram of a fifth modification example of the LD light emitting device according to the seventh embodiment.

FIG. 6E illustrates an outline configuration of a fifth modification example of the LD light emitting device 60 of this embodiment. The LD light emitting device 60 of the fifth modification example includes a dichroic mirror 71 for leading the blue light emitted from the LD element 58-1 and the green light emitted from the LD element 58-2 to the phosphor layer 62. In the LD light emitting device 60 of the fifth modification example, the light collecting lens 70 is provided between the dichroic mirror 71 and the phosphor layer 62. The light collecting lens 70 collects the blue light and the green light that are emitted from the dichroic mirror 71 to one point and causes the phosphor layer 62 to be irradiated with the collected light. The other configurations of the fifth modification example are the same as the basic configuration.

Figure 6F:
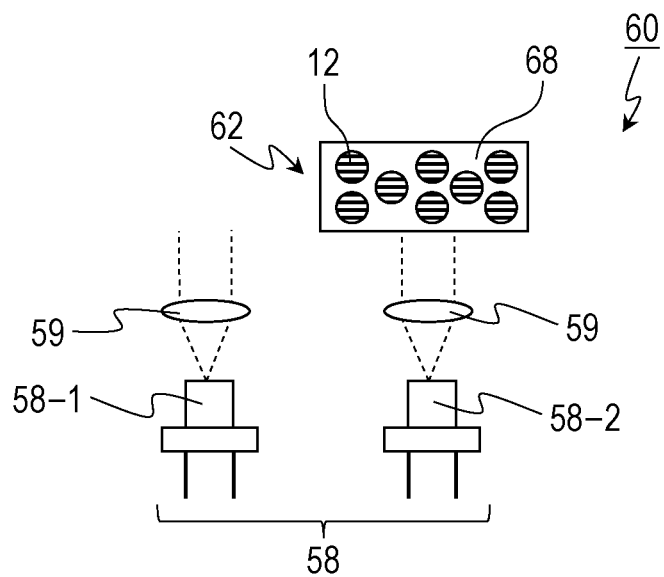
FIG. 6F is a schematic cross-sectional diagram of a sixth modification example of the LD light emitting device according to the seventh embodiment.

FIG. 6F illustrates an outline configuration of a sixth modification example of the LD light emitting device 60 of this embodiment. The LD light emitting device 60 of the sixth modification example has a configuration that does not cause the blue light emitted from the LD element 58-1 to be incident on the phosphor layer 62. That is, in the LD light emitting device 60 of the sixth modification example, only the green light emitted from the LD element 58-2 is incident on the phosphor layer 62. The other configurations of the sixth modification example are the same as the basic configuration. In the configuration of this sixth modification example, the green light that is emitted from the LD element 58-2 passes through the incidence optical system 59 and is incident on the phosphor layer 62. The red phosphor 12 of the phosphor layer 62 is excited by this incident light and emits red light. Further, the green light emitted from the LD element 58-2, which is not absorbed by the phosphor layer 62 but penetrates that, is radiated to the outside. In such a manner, the red light and green light that are radiated from the phosphor layer 62 to the outside are mixed with the blue light emitted from the LD element 58-1 and thereby become white light.

Figure 6G:
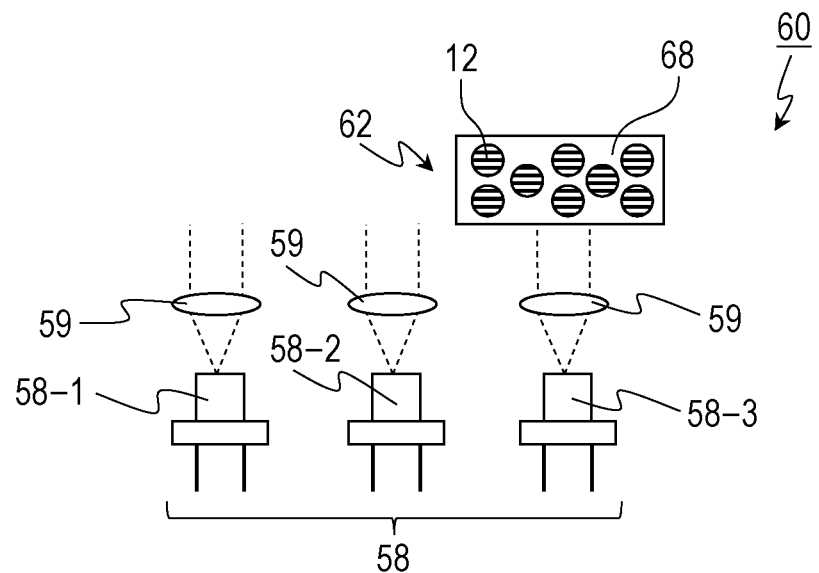
FIG. 6G is a schematic cross-sectional diagram of a seventh modification example of the LD light emitting device according to the seventh embodiment.

FIG. 6G illustrates an outline configuration of a seventh modification example of the LD light emitting device 60 of this embodiment. The LD light emitting device 60 of the seventh modification example further includes an LD element 58-3 in the basic configuration. The LD element 58-3 emits light in the green region. The LD element 58-3 has the peak of the light emission spectrum within a wavelength range of not less than 480 nm and not more than 550 nm, for example, and desirably has the peak of the light emission spectrum within a wavelength range of not less than 510 nm and not more than 540 nm. In the LD light emitting device 60 of the seventh modification example, only the green light emitted from the LD element 58-3 is incident on the phosphor layer 62. The blue light emitted from the LD element 58-1 and the green light emitted from the LD element 58-2 are not incident on the phosphor layer 62 but are used without any change. In the configuration of this seventh modification example, the green light that is emitted from the LD element 58-3 passes through the incidence optical system 59 and is incident on the phosphor layer 62. The red phosphor 12 of the phosphor layer 62 is excited by this incident light and emits red light. Further, the green light emitted from the LD element 58-2, which is not absorbed by the phosphor layer 62 but penetrates that, is radiated to the outside. In such a manner, the red light and green light that are radiated from the phosphor layer 62 to the outside are mixed with the blue light emitted from the LD element 58-1 and the green light emitted from the LD element 58-2 and thereby become white light.

Figure 6H:
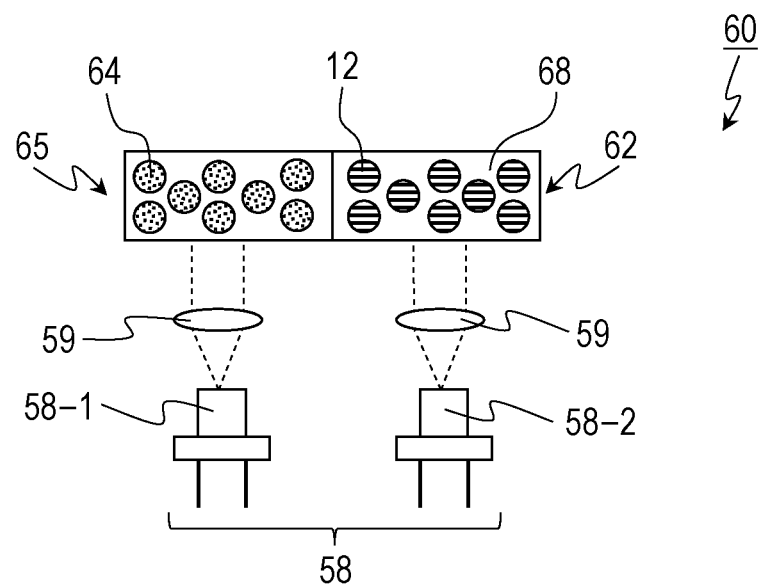
FIG. 6H is a schematic cross-sectional diagram of an eighth modification example of the LD light emitting device according to the seventh embodiment.

FIG. 6H illustrates an outline configuration of an eighth modification example of the LD light emitting device 60 of this embodiment. In the LD light emitting device 60 of the eighth modification example, only the green light emitted from the LD element 58-2 is incident on the phosphor layer 62. The blue light that is emitted from the LD element 58-1 is incident on a scatterer layer 65 that includes a scatterer 64. In the configuration of this eighth modification example, the green light that is emitted from the LD element 58-2 passes through the incidence optical system 59 and is incident on the phosphor layer 62. The red phosphor 12 of the phosphor layer 62 is excited by this incident light and emits red light. Further, the green light emitted from the LD element 58-2, which is not absorbed by the phosphor layer 62 but penetrates that, is radiated to the outside. Meanwhile, the blue light emitted from the LD element 58-1 is incident on the scatterer layer 65, scattered by the scatterer 64, and radiated to the outside as incoherent light. In such a manner, the red light and green light that are radiated from the phosphor layer 62 to the outside are mixed with the blue light radiated from the scatterer layer 65 and thereby become white light.

Figure 6I:
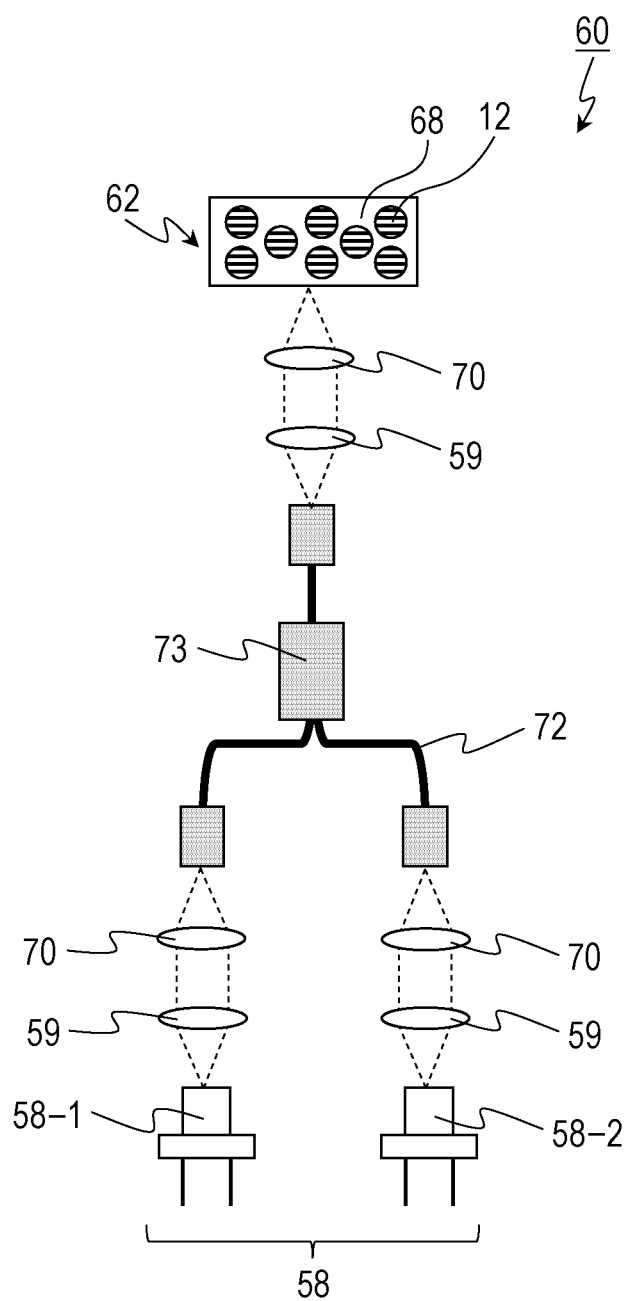
FIG. 6I is a schematic cross-sectional diagram of a ninth modification example of the LD light emitting device according to the seventh embodiment.

FIG. 6I illustrates an outline configuration of a ninth modification example of the LD light emitting device 60 of this embodiment. In the LD light emitting device 60 of the ninth modification example, the blue light emitted from the LD element 58-1 and the green light emitted from the LD element 58-2 are incident on the phosphor layer 62 via optical fibers 72. The LD light emitting device 60 of the ninth modification example includes the optical fibers 72 on which the blue light emitted from the LD element 58-1 and the green light emitted from the LD element 58-2 are incident and a multiplexer 73 that multiplexes blue light and green light. In the LD light emitting device 60 of the ninth modification example, multiplexed light is incident on the phosphor layer 62 via the incidence optical system 59 and the light collecting lens 70.

In the light emitting device of the seventh embodiment, the red phosphor that includes Ce as the luminescent center is used, and the red phosphor is excited by green light with high absorption efficiency. Thus, the quantum efficiency may be improved more than related art. In addition, in a case where the light emitting device of the seventh embodiment is configured as a white light emitting device, high color rendering and color reproducibility may be realized.

Eighth Embodiment

Figure 7:
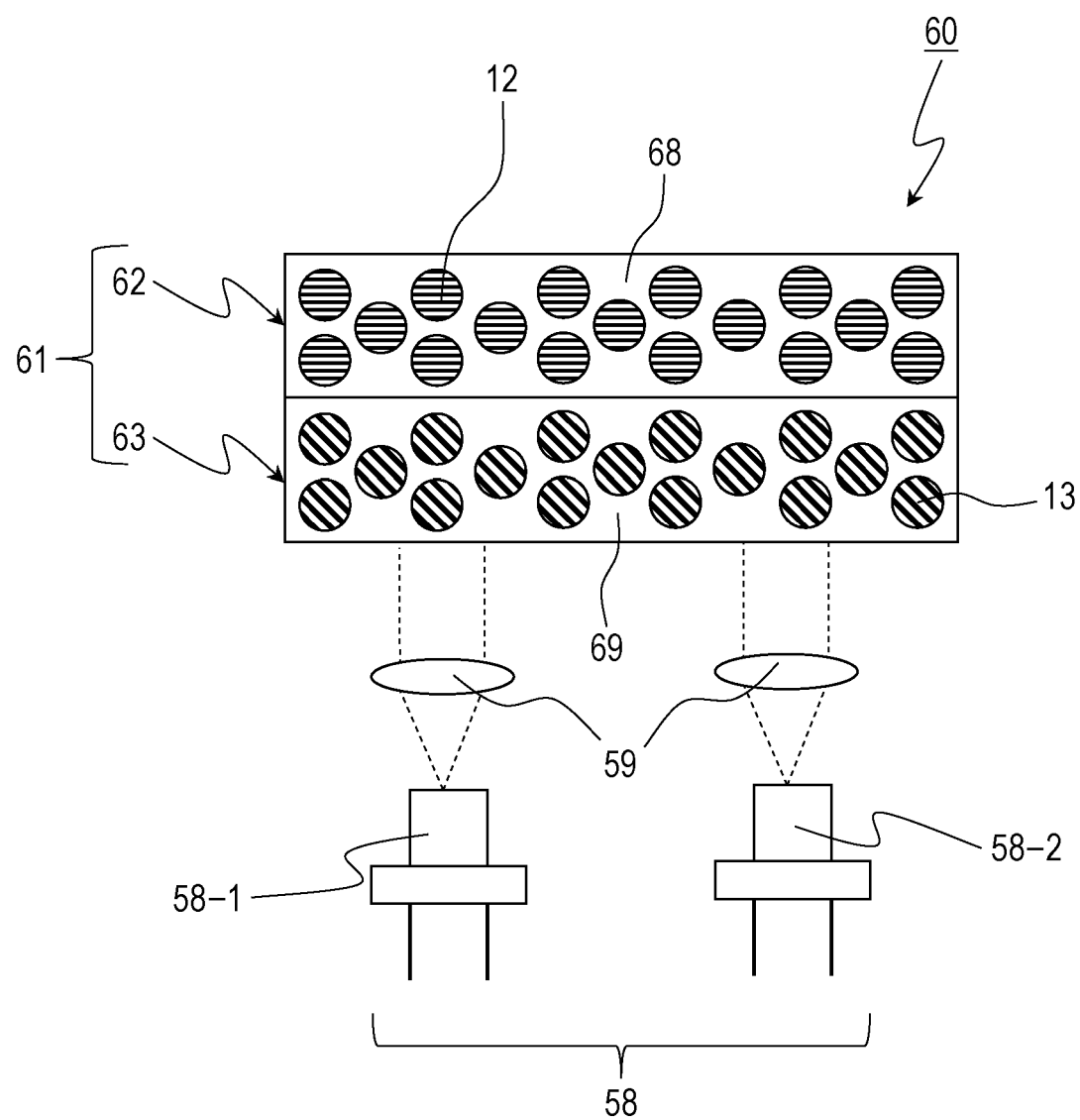
FIG. 7 is a schematic cross-sectional diagram of the LD light emitting device according to an eighth embodiment.

In an eighth embodiment, as one example of a light emitting device of the present disclosure, a description will be made about an LD light emitting device that includes an LD (one example of the light emitting element) as the light source. FIG. 7 illustrates an outline configuration of the LD light emitting device 60 according to the eighth embodiment. The LD light emitting device 60 of the eighth embodiment has the same configuration as the LD light emitting device 60 of the seventh embodiment, which is illustrated in FIG. 5, except the point that the wavelength conversion member 61 (one example of the wavelength conversion element) comprises two phosphor layers. Thus, only the wavelength conversion member 61 will be described here.

The phosphor of the wavelength conversion member 61 includes the red phosphor that includes Ce as the luminescent center. Because the red phosphor that includes Ce as the luminescent center is described in the first embodiment, a detailed description will not be made here. The wavelength conversion member 61 may further include a phosphor other than the red phosphor that includes Ce as the luminescent center, in accordance with the desired light emission color of the light emitting device. The wavelength conversion member 61 in this embodiment has a configuration in which the first phosphor layer 62 containing the red phosphor 12 including Ce as the luminescent center and the second phosphor layer 63 containing the yellow phosphor 13 are laminated.

The first phosphor layer 62 and the second phosphor layer 63 are respectively configured by using the binders 68 and 69. The binders 68 and 69 are media such as a resin, glass, or a transparent crystal, for example. The binders 68 and 69 may be formed of the same material or of different materials. Note that each of the phosphor layers may be configured only with phosphor particles.

Next, an action of the LD light emitting device 60 of this embodiment will be described.

The blue light emitted from the LD element 58-1 passes through the incidence optical system 59 and is incident on the second phosphor layer 63 of the wavelength conversion member 61. The yellow phosphor 13 of the second phosphor layer 63 is excited by this incident light and emits yellow light. Further, the blue light emitted from the LD element 58-1, which is not absorbed by the second phosphor layer 63 but penetrates that, is incident on the first phosphor layer 62. The red phosphor 12 of the first phosphor layer 62 is excited by this incidence and emits red light. Further, the yellow light that is radiated from the second phosphor layer 63 is incident on the first phosphor layer 62. The red phosphor 12 of the first phosphor layer 62 may be excited by a portion of this incident light and may emit red light. Further, the blue light emitted from the LD element 58-1, which is not absorbed by the first phosphor layer 62 or the second phosphor layer 63 but penetrates those, is radiated to the outside.

The green light emitted from the LD element 58-2 passes through the incidence optical system 59 and is incident on the second phosphor layer 63 of the wavelength conversion member 61. The yellow phosphor 13 of the second phosphor layer 63 is excited by this incident light and emits yellow light. Further, the green light emitted from the LD element 58-2, which is not absorbed by the second phosphor layer 63 but penetrates that, is incident on the first phosphor layer 62. The red phosphor 12 of the first phosphor layer 62 is excited by this incidence and emits red light. Further, the yellow light that is radiated from the second phosphor layer 63 is incident on the first phosphor layer 62. The red phosphor 12 of the first phosphor layer 62 may be excited by a portion of this incident light and may emit red light. Further, the green light emitted from the LD element 58-2, which is not absorbed by the first phosphor layer 62 or the second phosphor layer 63 but penetrates those, is radiated to the outside.

Those red light, yellow light, blue light, and green light are mixed and thereby become white light.

Note that the thickness of each of the phosphor layers may be adjusted such that the blue light emitted from the LD element 58 does not penetrate the first phosphor layer 62. Further, the thickness of each of the phosphor layers may be adjusted such that the yellow light emitted from the second phosphor layer 63 does not penetrate the first phosphor layer 62. In a case where the blue light and yellow light do not penetrate the first phosphor layer 62, only the red light is radiated to the outside. As another mode, the green phosphor that is described in the second embodiment may be used instead of the yellow phosphor 13 that is used for the second phosphor layer 63.

In the light emitting device of the eighth embodiment, the red phosphor that includes Ce as the luminescent center is used, and the red phosphor is excited by green light with high absorption efficiency. Thus, the quantum efficiency may be improved more than related art. In addition, in a case where the light emitting device of the eighth embodiment is configured as a white light emitting device, high color rendering and color reproducibility may be realized.

Ninth Embodiment

In a ninth embodiment, as one example of a light emitting device of the present disclosure, a description will be made about an LD light emitting device that includes an LD (one example of the light emitting element) as the light source. FIG. 8 illustrates an outline configuration of the LD light emitting device 80 according to the ninth embodiment. The same members as the seventh and eighth embodiments are provided with the same reference numerals, and a detailed description thereof may not be made.

The LD light emitting device 80 includes the LD element 58-1, the LD element 58-2, and the wavelength conversion member 81. The phosphor of the wavelength conversion member 81 has the wavelength conversion layer in which the red phosphor 12 is mixed with at least one kind selected from the group consisting of the yellow phosphor 13 and the green phosphor 14. As the red phosphor 12, the red phosphor that includes Ce as the luminescent center is used. Because the red phosphor that includes Ce as the luminescent center is described in the first embodiment, a detailed description will not be made here. As the yellow phosphor and the green phosphor, the phosphors that are exemplified in the second embodiment may be used. In this embodiment, a description will be made particularly about a case where the wavelength conversion member 81 is a phosphor layer that is formed by mixing three kinds of phosphors which are the red phosphor 12, the yellow phosphor 13, and the green phosphor 14. It is possible to appropriately adjust the mixing ratio of the three kinds of phosphors in response to the desired color tone of white light, the light emission intensities of the respective phosphors, and so forth.

The phosphor layer as the wavelength conversion member 81 is configured by using the binder 68. The binder 68 is a medium such as a resin, glass, or a transparent crystal, for example. The binder 68 may be formed of a single material or may be formed of a different material in accordance with the place. Note that the phosphor layer may be configured only with phosphor particles.

The blue light emitted from the LD element 58-1 passes through the incidence optical system 59 and is converted into red light, yellow light, and green light respectively by the red phosphor 12, the yellow phosphor 13, and the green phosphor 14 in the wavelength conversion member 81. The green light emitted from the LD element 58-2 passes through the incidence optical system 59 and is converted into red light and yellow light respectively by the red phosphor 12 and the yellow phosphor 13 in the wavelength conversion member 81. The blue light emitted from the LD element 58-1, which is not absorbed by the phosphors, the green light emitted from the LD element 58-2, which is not absorbed by the phosphors, and the red light, the yellow light, and the green light, which are respectively converted by the red phosphor 12, the yellow phosphor 13, and the green phosphor 14, are mixed and thereby become white light. Note that the red phosphor 12 may be excited by the incidence of a portion of the green light emitted from the green phosphor 14 and may emit red light. Further, the thickness of the wavelength conversion member 81 may be adjusted such that the blue light emitted from the LD element 58-1 and the green light emitted from the LD element 58-2 do not penetrate the wavelength conversion member 81. In this case, only the red light is radiated to the outside.

Next, modification examples of the LD light emitting device 80 of this embodiment will be described with reference to FIG. 9A to FIG. 9C. Note that in the following description, the configuration of the LD light emitting device 80, which is illustrated in FIG. 8, may be referred to as basic configuration.

Figure 9A:
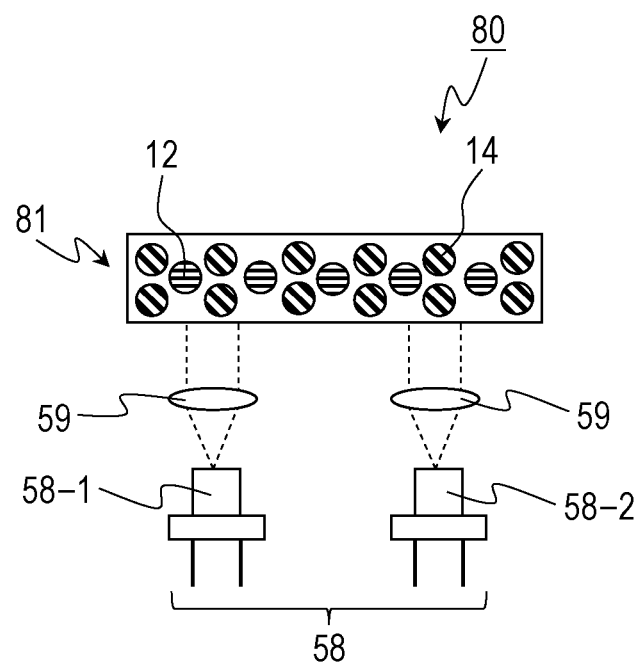
FIG. 9A is a schematic cross-sectional diagram of a first modification example of the LD light emitting device according to the ninth embodiment.

FIG. 9A illustrates an outline configuration of a first modification example of the LD light emitting device 80 of this embodiment. In the LD light emitting device 80 of the first modification example, the wavelength conversion member 81 is a phosphor layer that is formed by mixing two kinds of phosphors which are the red phosphor 12 and the green phosphor 14. The other configurations of the first modification example are the same as the basic configuration. In this configuration, the blue light emitted from the LD element 58-1 passes through the incidence optical system 59 and is incident on the wavelength conversion member 81. The red phosphor 12 of the wavelength conversion member 81 is excited by this incident light and emits red light. Further, the blue light emitted from the LD element 58-1, which is not absorbed by the wavelength conversion member 81 but penetrates that, is radiated to the outside. The green light emitted from the LD element 58-2 passes through the incidence optical system 59 and is incident on the wavelength conversion member 81. The red phosphor 12 of the wavelength conversion member 81 is excited by this incident light and emits red light. Further, the green light emitted from the LD element 58-2, which is not absorbed by the wavelength conversion member 81 but penetrates that, is radiated to the outside. Those red light, green light, and blue light are mixed and thereby become white light.

Figure 9B:
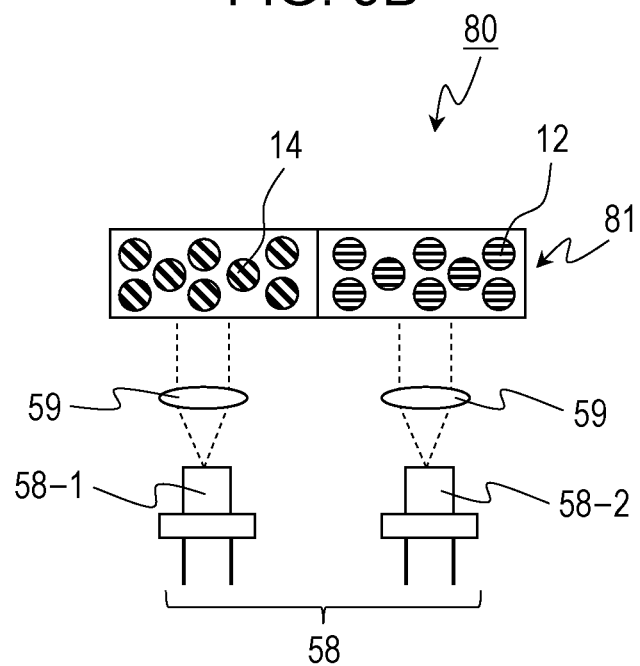
FIG. 9B is a schematic cross-sectional diagram of a second modification example of the LD light emitting device according to the ninth embodiment.

FIG. 9B illustrates an outline configuration of a second modification example of the LD light emitting device 80 of this embodiment. In the LD light emitting device 80 of the second modification example, the wavelength conversion member 81 is divided into two regions of a region in which the red phosphor 12 is provided and a region in which the green phosphor 14 is provided. Specifically, in the wavelength conversion member 81, a region that is irradiated with the blue light emitted from the LD element 58-1 is the region in which the green phosphor 14 is provided. A region that is irradiated with the green light emitted from the LD element 58-2 is the region in which the red phosphor 12 is provided. The other configurations of the second modification example are the same as the basic configuration. In this configuration, the blue light emitted from the LD element 58-1 passes through the incidence optical system 59 and is incident on the wavelength conversion member 81. The green phosphor 14 of the wavelength conversion member 81 are excited by this incident light and emits green light. Further, the blue light emitted from the LD element 58-1, which is not absorbed by the wavelength conversion member 81 but penetrates that, is radiated to the outside. The green light emitted from the LD element 58-2 passes through the incidence optical system 59 and is incident on the wavelength conversion member 81. The red phosphor 12 of the wavelength conversion member 81 is excited by this incident light and emits red light. Further, the green light emitted from the LD element 58-2, which is not absorbed by the wavelength conversion member 81 but penetrates that, is radiated to the outside. Those red light, green light, and blue light are mixed and thereby become white light.

Figure 9C:
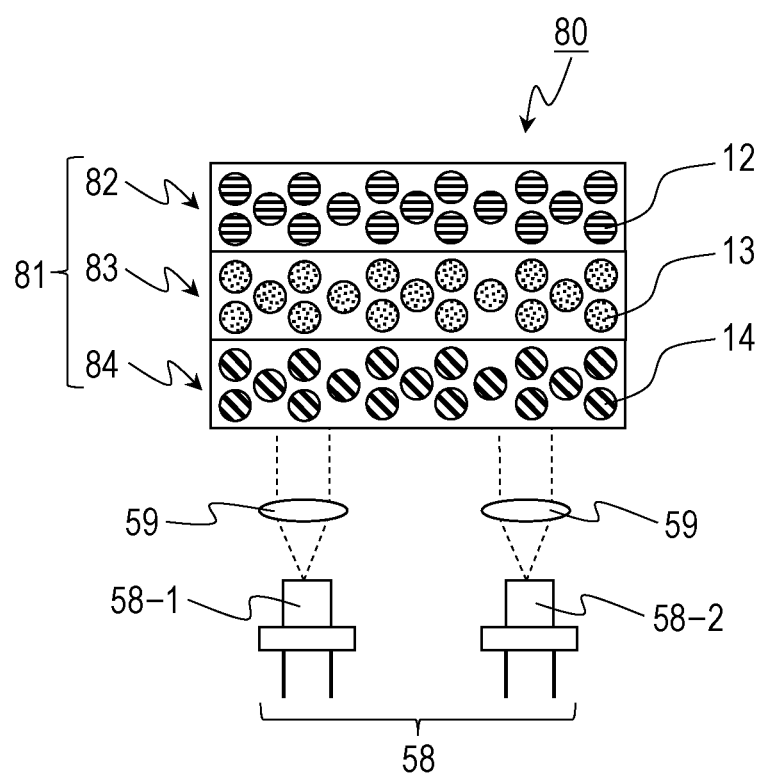
FIG. 9C is a schematic cross-sectional diagram of a third modification example of the LD light emitting device according to the ninth embodiment.

FIG. 9C illustrates an outline configuration of a third modification example of the LD light emitting device 80 of this embodiment. In the LD light emitting device 80 of the third modification example, the wavelength conversion member 81 has a configuration in which a first phosphor layer 82 containing the red phosphor 12, a second phosphor layer 83 containing the yellow phosphor 13, and a third phosphor layer 84 containing the green phosphor 14 are laminated. The other configurations of the third modification example are the same as the basic configuration. In this configuration, the blue light emitted from the LD element 58-1 passes through the incidence optical system 59 and is incident on the third phosphor layer 84 of the wavelength conversion member 81. The green phosphor 14 of the third phosphor layer 84 is excited by this incident light and emits green light. Further, the blue light emitted from the LD element 58-1, which is not absorbed by the third phosphor layer 84 but penetrates that, is incident on the second phosphor layer 83. The yellow phosphor 13 of the second phosphor layer 83 is excited by this incidence and emits yellow light. Further, the blue light emitted from the LD element 58-1, which is not absorbed by the second phosphor layer 83 but penetrates that, is incident on the first phosphor layer 82. The red phosphor 12 of the first phosphor layer 82 is excited by this incidence and emits red light. Meanwhile, the green light emitted from the LD element 58-2 passes through the incidence optical system 59 and is incident on the third phosphor layer 84 of the wavelength conversion member 81. The green light emitted from the LD element 58-2, which is not absorbed by the third phosphor layer 84 but penetrates that, is incident on the second phosphor layer 83. The yellow phosphor 13 of the second phosphor layer 83 is excited by this incidence and emits yellow light. Further, the green light emitted from the LD element 58-2, which is not absorbed by the second phosphor layer 83 but penetrates that, is incident on the first phosphor layer 82. The red phosphor 12 of the first phosphor layer 82 is excited by this incidence and emits red light. Further, the red phosphor of the first phosphor layer 82 may be excited by the green light emitted from the third phosphor layer 84 and may emit red light. Those red light, yellow light, blue light, and green light are mixed and thereby become white light.

In the light emitting device of the ninth embodiment, the red phosphor that uses Ce as the luminescent center is used, and the red phosphor is excited by green light with high absorption efficiency. Thus, the quantum efficiency may be improved more than related art. In addition, in a case where the light emitting device of the ninth embodiment is configured as a white light emitting device, high color rendering and color reproducibility may be realized.

Tenth Embodiment

Figure 10:
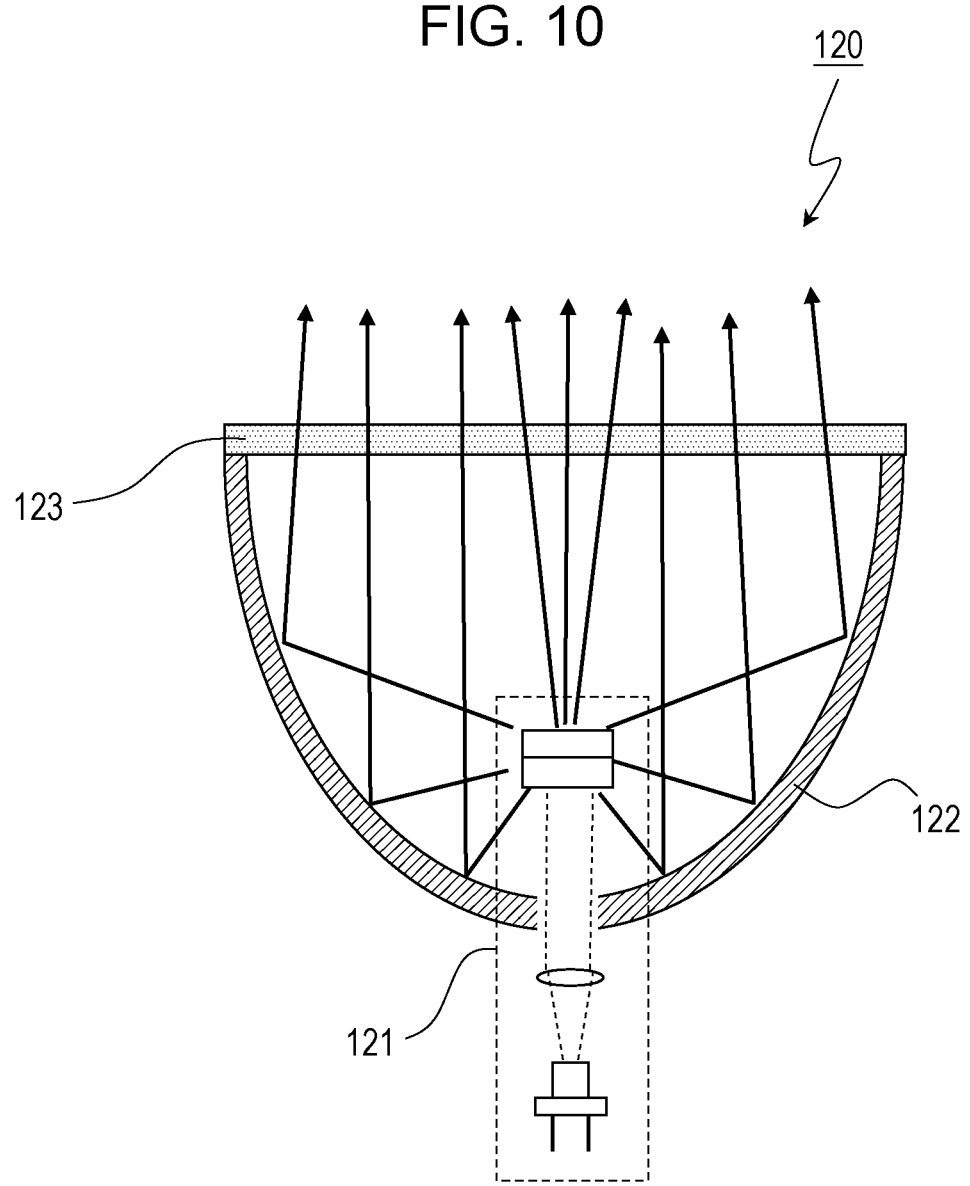
FIG. 10 is a schematic cross-sectional diagram of an illumination device according to a tenth embodiment.

In a tenth embodiment, one example of an illumination device of the present disclosure will be described. FIG. 10 illustrates an outline configuration of an illumination device 120 according to the tenth embodiment. The illumination device 120 includes a light source 121 and an emission optical system 122 that leads the light emitted by the light source 121 forward. In order to adjust the light emission color from the light source, a wavelength cutoff filter 123 that absorbs or reflects the light from the light source may be provided. The light source 121 includes the red phosphor that includes Ce as the luminescent center. Further, the light source 121 may be the light emitting device 10, 60, or 80 of the second to ninth embodiments. The emission optical system 122 may be a reflector, for example. The emission optical system 122 may have a metal film such as Al or Ag or an Al film in which a protective film is formed on a surface.

In the illumination device of the tenth embodiment, the red phosphor that includes Ce as the luminescent center is used, and the quantum efficiency in high power excitation may thus be improved more than an illumination device in related art. In addition, in a case where the illumination device is configured as a white illumination device, high color rendering and color reproducibility may be realized.

Eleventh Embodiment

Figure 11:
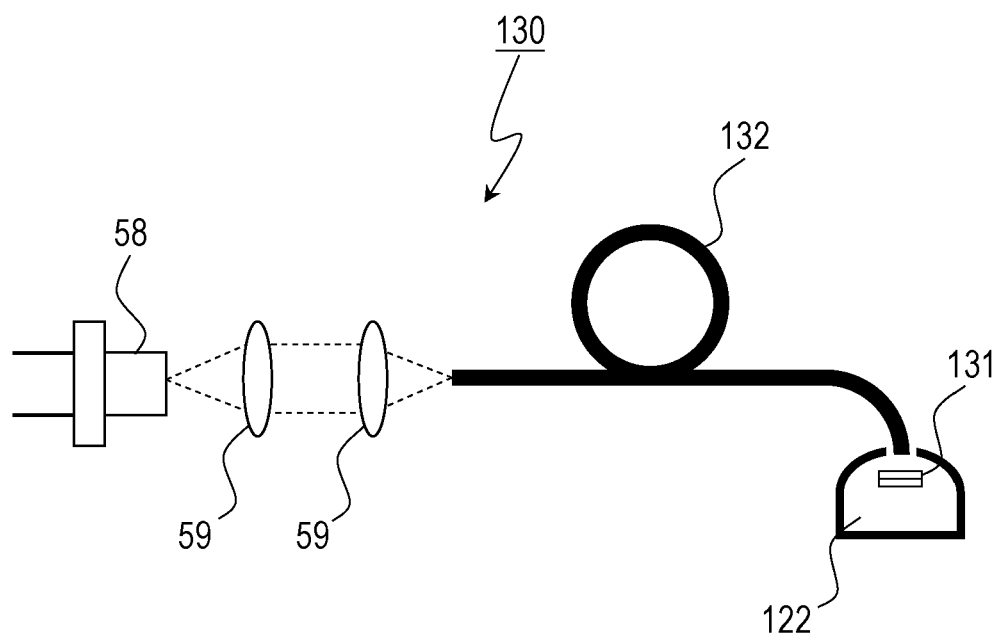
FIG. 11 is a schematic cross-sectional diagram of an illumination device according to an eleventh embodiment.

In an eleventh embodiment, as one example of an illumination device of the present disclosure, an illumination device that uses an optical fiber will be described. FIG. 11 illustrates an outline configuration of an illumination device 130 according to the eleventh embodiment. The illumination device 130 includes the LD element 58, the incidence optical system 59, an optical fiber 132, a wavelength conversion member 131, and the emission optical system 122.

The light emitted by the LD element 58 passes through the incidence optical system 59 and is led to the optical fiber 132. The optical fiber 132 leads the light to an emitting unit. The emitting unit includes the wavelength conversion member 131 and the emission optical system 122, for example. The wavelength conversion member 131 includes the red phosphor of the first embodiment. Further, the wavelength conversion member 131 may be the wavelength conversion member 61 or 81 of the third or fourth embodiment. Note that the wavelength conversion member 131 may be positioned on an emission side of the optical fiber 132 as FIG. 11 but may be positioned on an incidence side of the optical fiber 132 (for example, between the LD element 58 and the incidence optical system 59 or between the incidence optical system 59 and the optical fiber 132).

In the illumination device of the eleventh embodiment, the irradiation direction of light may easily be changed by using the optical fiber.

Further, the red phosphor of the first embodiment is used, and the quantum efficiency in high power excitation may thus be improved more than an illumination device in related art. In addition, in a case where the illumination device is configured as a white illumination device, high color rendering and color reproducibility may be realized.

Twelfth Embodiment

Figure 12:
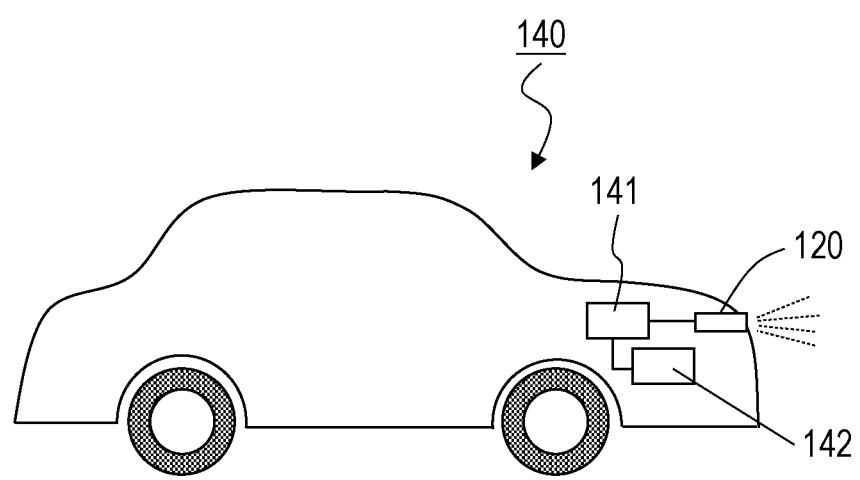
FIG. 12 is a schematic cross-sectional diagram of a vehicle according to a twelfth embodiment.

In a twelfth embodiment, as an application example of an illumination device of the present disclosure, a vehicle that includes an illumination device will be described. FIG. 12 illustrates an outline configuration of a vehicle 140 according to the twelfth embodiment. The vehicle 140 includes a headlamp for a vehicle as the illumination device 120 of the tenth embodiment and a power supply source 141. Further, the vehicle 140 may have a generator 142 that is driven and rotated by a driving source such as an engine and generates power. The power that is produced by the generator 142 may be stored in the power supply source 141. The power supply source 141 may be a secondary battery that is capable of charge and discharge. The illumination device 120 is lit by the power from the power supply source 141. The vehicle 140 may be an automobile, a two-wheeled vehicle, or a specialized vehicle, for example. Further, the vehicle 140 may be an engine vehicle, an electric vehicle, or a hybrid vehicle.

In the vehicle of the twelfth embodiment, the headlamp for a vehicle that includes the red phosphor which includes Ce as the luminescent center is used, and the front side may thus be illuminated more brightly in high power excitation than related art. In addition, in a case where the illumination device is configured as a white illumination device, high color rendering and color reproducibility may be realized.

Examples

In the following, the present disclosure will be described in detail. However, the present disclosure is not limited to those examples.

<Measurement of Light Emission and Excitation Spectra>

The light emission spectrum and the excitation spectrum of the phosphors were measured by using a spectrofluorophotometer (FP-6500 of JASCO Corporation). As for the measurement of the light emission spectrum, a peak wavelength of excitation light was set to 500 nm, and the light emission of the phosphor was measured in a range of 550 to 800 nm. The peak wavelength in this case was obtained as the light emission peak wavelength. As for the measurement of the excitation spectrum, the monitoring wavelength of the light emission of the phosphor was set to 600 nm, and the measurement was performed while the excitation light was changed in a range of 350 to 550 nm. The peak wavelength that appeared at the longest wavelength in this case was obtained as the excitation peak wavelength.

<Evaluation of Light Emission Lifetime>

The light emission lifetime of the phosphor was measured by using a fluorescence lifetime measurement device (Quantaurus-Tau Fluorescence lifetime spectrometer of Hamamatsu Photonics K.K.). The peak wavelength of the excitation light was set to 470 nm, the monitoring wavelength of the light emission of the phosphor was set to 620 nm, and the time change in the light emission intensity with respect to the time after the excitation light was blocked was measured. The time when the light emission intensity in this case became 1/e with respect to the light emission intensity at the time before the excitation light was blocked was obtained as the 1/e light emission lifetime.

<Evaluation of Crystal Structure>

The powder X-ray diffraction pattern of the phosphor was measured by using an X-ray diffraction measurement device (RINT2100 of Rigaku Corporation). Cu-Kα rays were used for the measurement, and the measurement was performed under the conditions indicated in Table 1.

TABLE 1

| Starting angle | Finishing angle | Sampling width | Scanning speed | Tube voltage | Tube current | Divergence slit | Scattering slit | Light reception slit |
|---|---|---|---|---|---|---|---|---|
| 10° | 50° | 0.02° | 4°/min | 40 kv | 40 mA | 1° | 1° | 0.15 mm |

<Synthesis of Phosphors>

As the starting materials, YN powder, $Y_2O_3$ powder, $Si_3N_4$ powder, CeN powder, $CeO_2$ powder, LaN powder, and AlN powder were prepared. In order to synthesize the respective phosphors of sample Nos. 1 to 12, the powders as the starting materials were selected from those powders and used as indicated in Table 2. In addition, the selected powders were weighed and mixed such that the compound composition indicated in Table 2 was obtained. Mixing of the powders of the starting materials was performed by dry mixing by using a mortar in a glove box under a nitrogen atmosphere. The material powder obtained by the mixing was placed in a crucible made of boron nitride. The material powder was sintered at 1900° C. under a nitrogen atmosphere of 0.5 MPa for 2 hours. The phosphors of sample Nos. 1 to 12 were fabricated by the above method.

<Evaluation of Phosphors>

The light emission spectra and the excitation spectra of the phosphors of sample Nos. 1 to 12 are illustrated in FIGS. 13 to 24. The XRD patterns of the phosphors of sample Nos. 1 to 12 are illustrated in FIGS. 25 to 29. The light emission peak wavelengths, the excitation peak wavelengths, and the 1/e light emission lifetimes of the phosphors of sample Nos. 1 to 12 are indicated in Table 3. Note that in Tables 2 and 3, sample No. 9 with which a symbol of "*" is indicated for the sample number is the phosphor of a comparative example.

Figure 13:
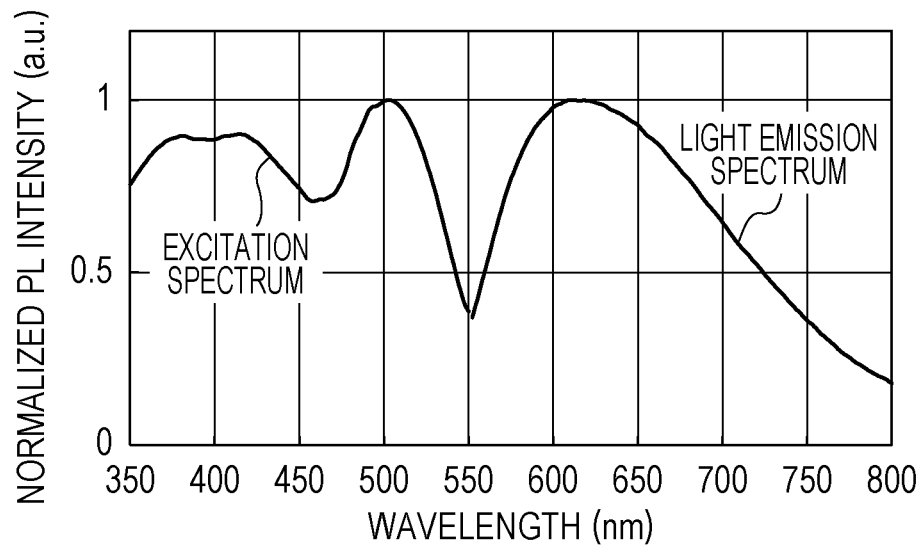
FIG. 13 is a diagram that illustrates a light emission spectrum and an excitation spectrum of a phosphor of sample No. 1.
Figure 14:
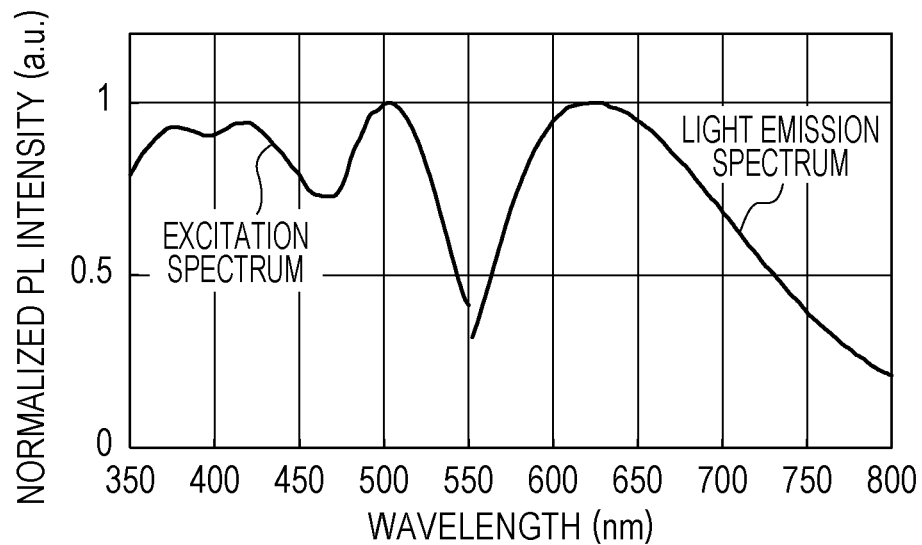
FIG. 14 is a diagram that illustrates the light emission spectrum and the excitation spectrum of the phosphor of sample No. 2.

First, the relationships between the starting materials and the phosphors will be discussed. As indicated in FIGS. 13 and 14 and Table 3, as for the phosphors of sample Nos. 1 and 2, red light emission that had the light emission peak wavelengths in a wavelength range of not less than 600 nm and not more than 660 nm was observed. In addition, it was observed that the phosphors of sample Nos. 1 and 2 had the excitation peak wavelengths at a wavelength of 500 nm or more. Further, from the XRD patterns illustrated in FIG. 25, it was found that the phosphors of sample Nos. 1 and 2 had similar peak patterns to an $Er_6Si_{11}N_{20}O$ crystal. Note that it is considered that the reason why the peak positions of the XRD patterns of the phosphors of sample Nos. 1 and 2 are shifted to a low angle side with respect to the XRD pattern of the $Er_6Si_{11}N_{20}O$ crystal is because the Er site is substituted by Y in the phosphors of sample Nos. 1 and 2 and the lattice constants thus change. From those results, it was observed that a similar crystal system to a $Y_6Si_{11}N_{20}O$ crystal might be synthesized regardless of the used starting materials. Further, from the comparison between sample No. 1 and sample No. 2, it may be understood that a similar crystal system to the $Y_6Si_{11}N_{20}O$ crystal may be synthesized even in a case where compounding is performed such that the N amount is excessive in the material powder.

TABLE 2

| Sample No. | Compound composition | Ce substitution concentration x | La substitution concentration y | Al substitution concentration z | Ce material | Y material | Si material | La material | Al material |
|---|---|---|---|---|---|---|---|---|---|
| 1 | $(Y_{0.917},Ce_{0.083})_6Si_{11}N_{20.17}O$ | 0.083 | — | — | $CeO_2$ | YN | $Si_3N_4$ | — | — |
| 2 | $(Y_{0.917},Ce_{0.083})_6Si_{11}N_{20}O$ | 0.083 | — | — | CeN | YN, $Y_2O_3$ | $Si_3N_4$ | — | — |
| 3 | $(Y_{0.99},Ce_{0.01})_6Si_{11}N_{20}O$ | 0.01 | — | — | CeN | YN, $Y_2O_3$ | $Si_3N_4$ | — | — |
| 4 | $(Y_{0.97},Ce_{0.03})_6Si_{11}N_{20}O$ | 0.03 | — | — | CeN | YN, $Y_2O_3$ | $Si_3N_4$ | — | — |
| 5 | $(Y_{0.87},Ce_{0.03},La_{0.1})_6Si_{11}N_{20}O$ | 0.03 | 0.1 | — | CeN | YN, $Y_2O_3$ | $Si_3N_4$ | LaN | — |
| 6 | $(Y_{0.77},Ce_{0.03},La_{0.2})_6Si_{11}N_{20}O$ | 0.03 | 0.2 | — | CeN | YN, $Y_2O_3$ | $Si_3N_4$ | LaN | — |
| 7 | $(Y_{0.67},Ce_{0.03},La_{0.3})_6Si_{11}N_{20}O$ | 0.03 | 0.3 | — | CeN | YN, $Y_2O_3$ | $Si_3N_4$ | LaN | — |
| 8 | $(Y_{0.57},Ce_{0.03},La_{0.4})_6Si_{11}N_{20}O$ | 0.03 | 0.4 | — | CeN | YN, $Y_2O_3$ | $Si_3N_4$ | LaN | — |
| *9 | $(Y_{0.47},Ce_{0.03},La_{0.5})_6Si_{11}N_{20}O$ | 0.03 | 0.5 | — | CeN | YN, $Y_2O_3$ | $Si_3N_4$ | LaN | — |
| 10 | $(Y_{0.77},Ce_{0.03},La_{0.2})_6Si_{10.5}Al_{0.5}N_{19.83}O$ | 0.03 | 0.2 | 0.5 | CeN | YN, $Y_2O_3$ | $Si_3N_4$ | LaN | AlN |
| 11 | $(Y_{0.94},Ce_{0.01},La_{0.05})_6Si_{12}N_{22}$ | 0.01 | 0.05 | — | CeN | YN | $Si_3N_4$ | LaN | — |
| 12 | $(Y_{0.85},Ce_{0.1},La_{0.05})_6Si_{12}N_{22}$ | 0.1 | 0.05 | — | CeN | YN | $Si_3N_4$ | LaN | — |

TABLE 3

| Sample No. | Compound composition | Light emission peak wavelength (nm) | Excitation peak wavelength (nm) | 1/e light emission lifetime (ns) |
|---|---|---|---|---|
| 1 | $(Y_{0.917}, Ce_{0.083})_6Si_{11}N_{20.17}O$ | 611 | 503 | 22 |
| 2 | $(Y_{0.917}, Ce_{0.083})_6Si_{11}N_{20}O$ | 628 | 503 | 22 |
| 3 | $(Y_{0.99}, Ce_{0.01})_6Si_{11}N_{20}O$ | 606 | 493 | 34 |
| 4 | $(Y_{0.97}, Ce_{0.03})_6Si_{11}N_{20}O$ | 608 | 500 | 30 |
| 5 | $(Y_{0.87}, Ce_{0.03}, La_{0.1})_6Si_{11}N_{20}O$ | 624 | 500 | 27 |
| 6 | $(Y_{0.77}, Ce_{0.03}, La_{0.2})_6Si_{11}N_{20}O$ | 641 | 501 | 25 |
| 7 | $(Y_{0.67}, Ce_{0.03}, La_{0.3})_6Si_{11}N_{20}O$ | 649 | 500 | 25 |
| 8 | $(Y_{0.57}, Ce_{0.03}, La_{0.4})_6Si_{11}N_{20}O$ | 608 | 473 | 44 |
| *9 | $(Y_{0.47}, Ce_{0.03}, La_{0.5})_6Si_{11}N_{20}O$ | 599 | 468 | 45 |
| 10 | $(Y_{0.77}, Ce_{0.03}, La_{0.2})_6Si_{10.5}Al_{0.5}N_{19.83}O$ | 641 | 482 | 26 |
| 11 | $(Y_{0.94}, Ce_{0.01}, La_{0.05})_6Si_{12}N_{22}$ | 629 | 492 | 29 |
| 12 | $(Y_{0.85}, Ce_{0.1}, La_{0.05})_6Si_{12}N_{22}$ | 643 | 511 | 21 |

Figure 15:
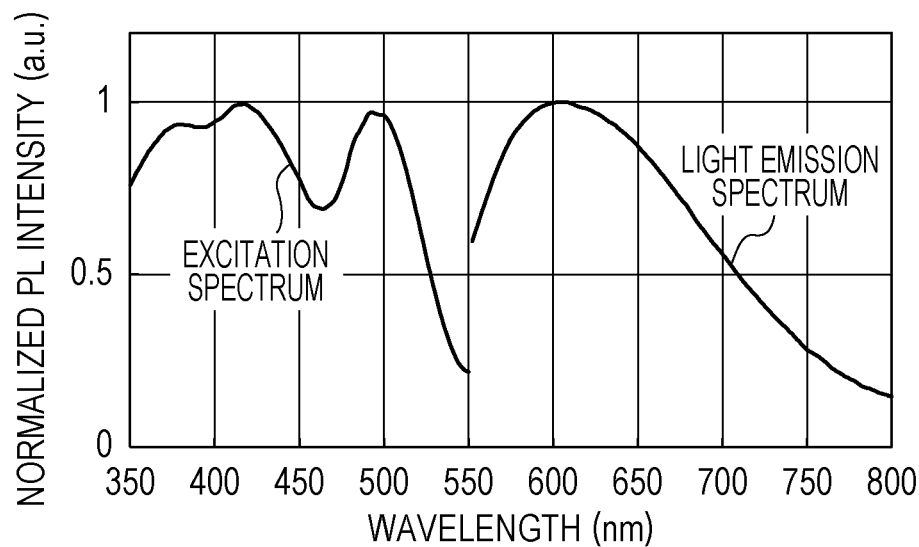
FIG. 15 is a diagram that illustrates the light emission spectrum and the excitation spectrum of the phosphor of sample No. 3.
Figure 16:
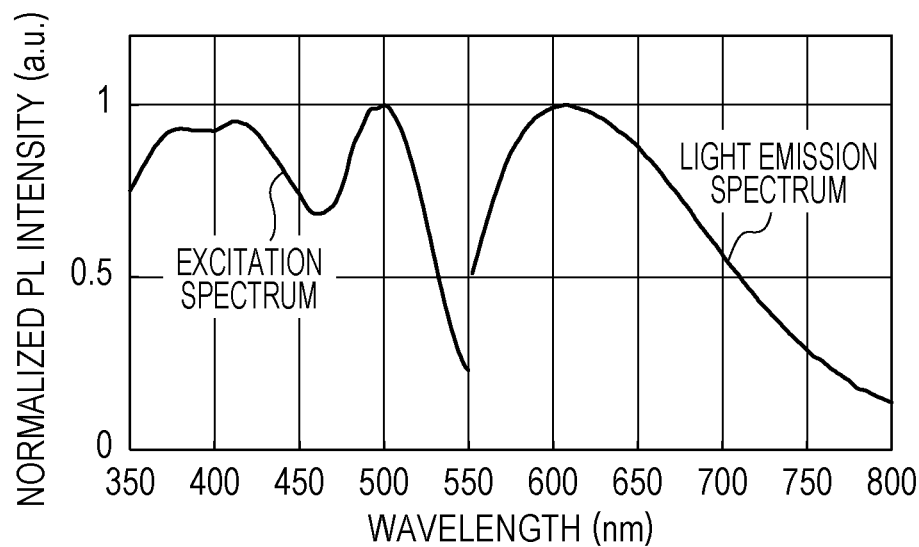
FIG. 16 is a diagram that illustrates the light emission spectrum and the excitation spectrum of the phosphor of sample No. 4.
Figure 17:
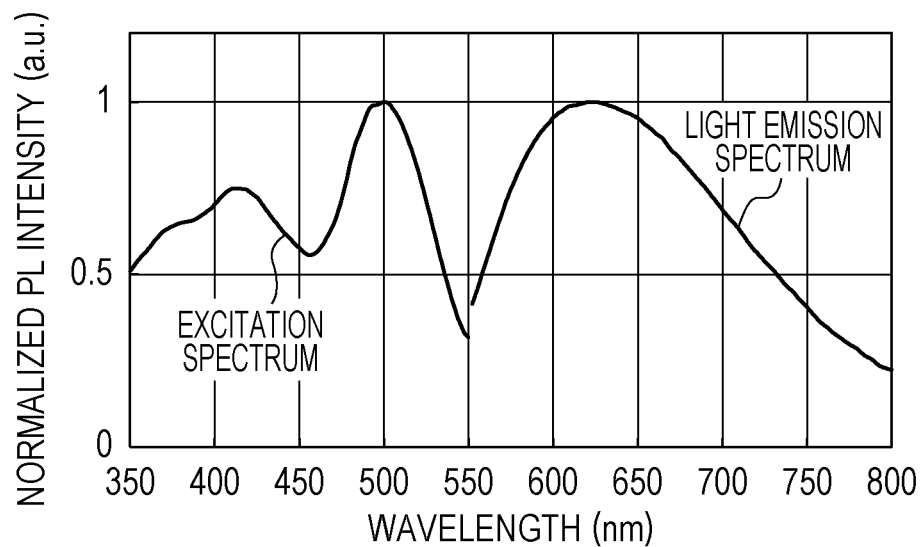
FIG. 17 is a diagram that illustrates the light emission spectrum and the excitation spectrum of the phosphor of sample No. 5.

Next, the Ce substitution concentration will be discussed. As indicated in FIGS. 14 to 16 and Table 3, from the comparison among the phosphors of sample Nos. 2 to 4, it may be understood that the light emission wavelength is shifted to a longer wavelength as the Ce substitution concentration increases. As the Ce concentration (the value of x) in the phosphor increases, the mutual overlaps among the wave functions of the excitation levels of Ce become larger. Then, the excitation level energy width increases, a sort of band is formed, and the energy difference from the ground level thus decreases. Further, as indicated in Table 3, from the comparison among the phosphors of sample Nos. 2 to 4, it may be understood that the light emission lifetime becomes shorter as the Ce substitution concentration increases. As the Ce concentration increases, energy transfer among neighboring Ce atoms is more likely to occur, and energy migration occurs. While energy migration is occurring, in a case where an electron is captured in a defect in the crystal, the electron is relaxed as a non-radiative transition. That is, it is considered that because the probability that electrons with a comparatively low transition probability result in non-light-emission (non-radiative transition) rises as the Ce concentration increases, the light emission lifetime becomes shorter. Note that from the XRD patterns illustrated in FIG. 26, it may be observed that the phosphors of sample Nos. 3 and 4 have similar peaks to the $Er_6Si_{11}N_{20}O$ crystal and similar crystal systems to the $Y_6Si_{11}N_{20}O$ crystal may be synthesized.

Next, the La substitution concentration will be discussed. As indicated in FIGS. 16 to 21 and Table 3, from the comparison among the phosphors of sample Nos. 4 to 9, it may be understood that the light emission wavelength is shifted to a longer wavelength at the La substitution concentration of 30% or less (y≤0.3). At the La substitution concentration of 40% or more (0.4≤y), both of the light emission wavelength and the excitation wavelength are shifted to a shorter wavelength, the light emission peak wavelength of the phosphor of sample No. 9 whose La substitution concentration reaches 50% is less than 600 nm, and further the excitation peak wavelength is less than 470 nm. From those results, it was observed that in order to realize red light emission that had the light emission peak wavelength in a wavelength range of not less than 600 nm and not more than 660 nm, the La substitution concentration had to be 40% or less, that is, y had to satisfy y≤0.4. Further, it was observed that in a case where the phosphor of green excitation whose excitation peak wavelength was 480 nm or more was obtained, the La substitution concentration was desirably 30% or less, that is, y desirably satisfied y≤0.3. Note that from the XRD patterns illustrated in FIG. 27, it may be observed that the phosphors of sample Nos. 5 to 9 have similar peaks to the $Er_6Si_{11}N_{20}O$ crystal and similar crystal systems to the $Y_6Si_{11}N_{20}O$ crystal may be synthesized.

Figure 18:
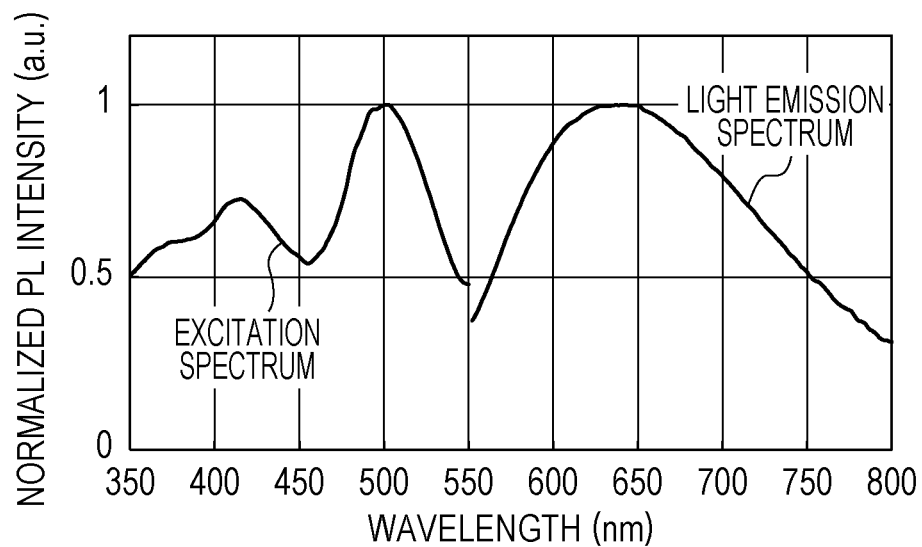
FIG. 18 is a diagram that illustrates the light emission spectrum and the excitation spectrum of the phosphor of sample No. 6.
Figure 19:
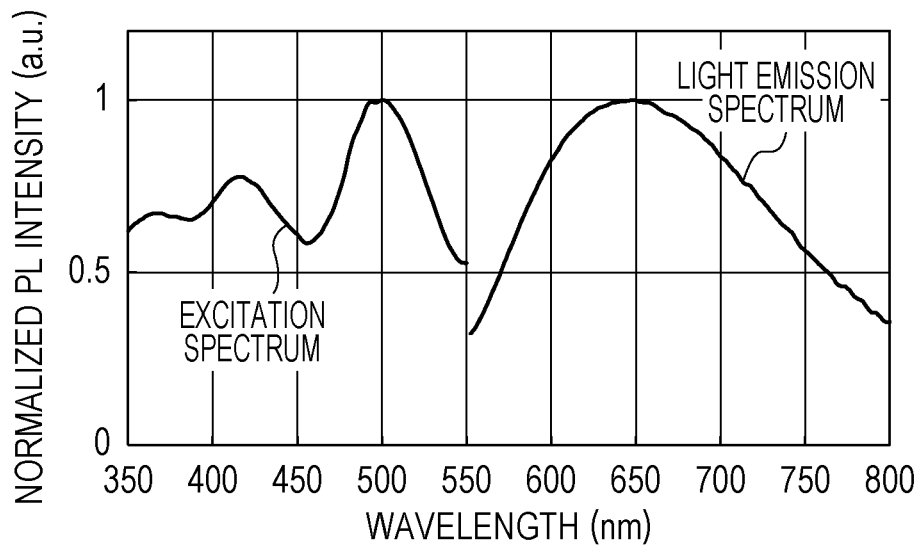
FIG. 19 is a diagram that illustrates the light emission spectrum and the excitation spectrum of the phosphor of sample No. 7.
Figure 20:
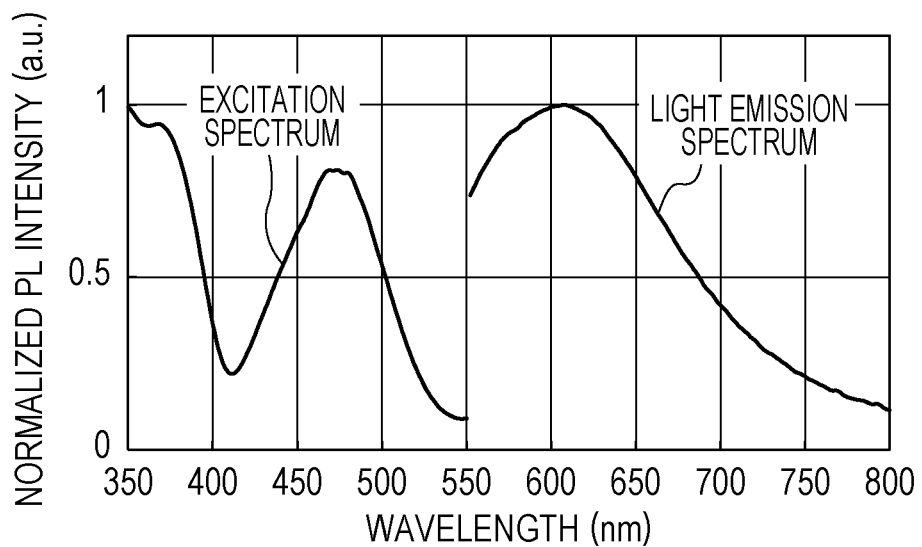
FIG. 20 is a diagram that illustrates the light emission spectrum and the excitation spectrum of the phosphor of sample No. 8.
Figure 21:
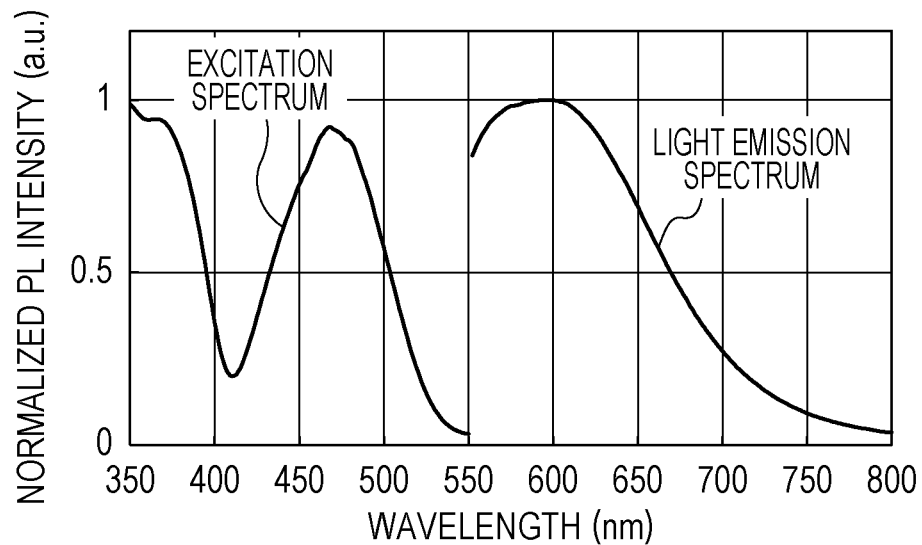
FIG. 21 is a diagram that illustrates the light emission spectrum and the excitation spectrum of the phosphor of sample No. 9.
Figure 22:
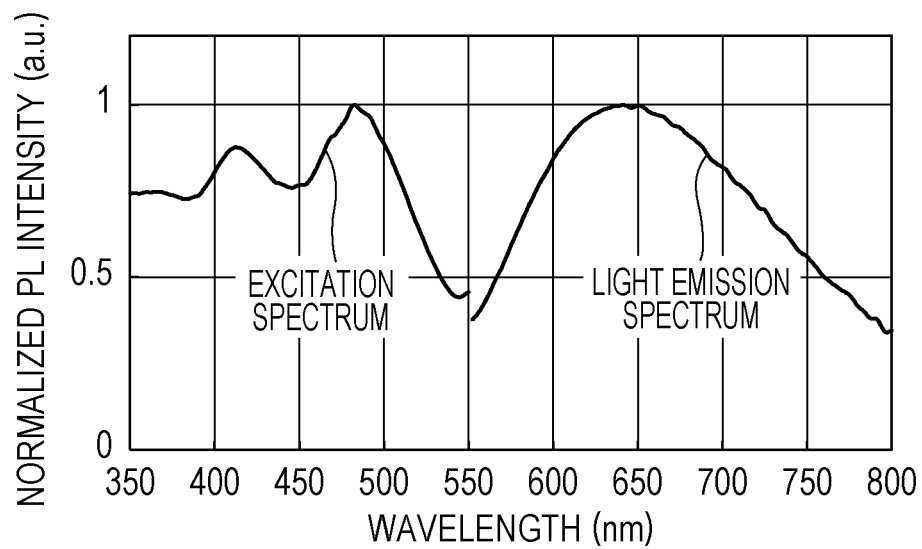
FIG. 22 is a diagram that illustrates the light emission spectrum and the excitation spectrum of the phosphor of sample No. 10.
Figure 28:
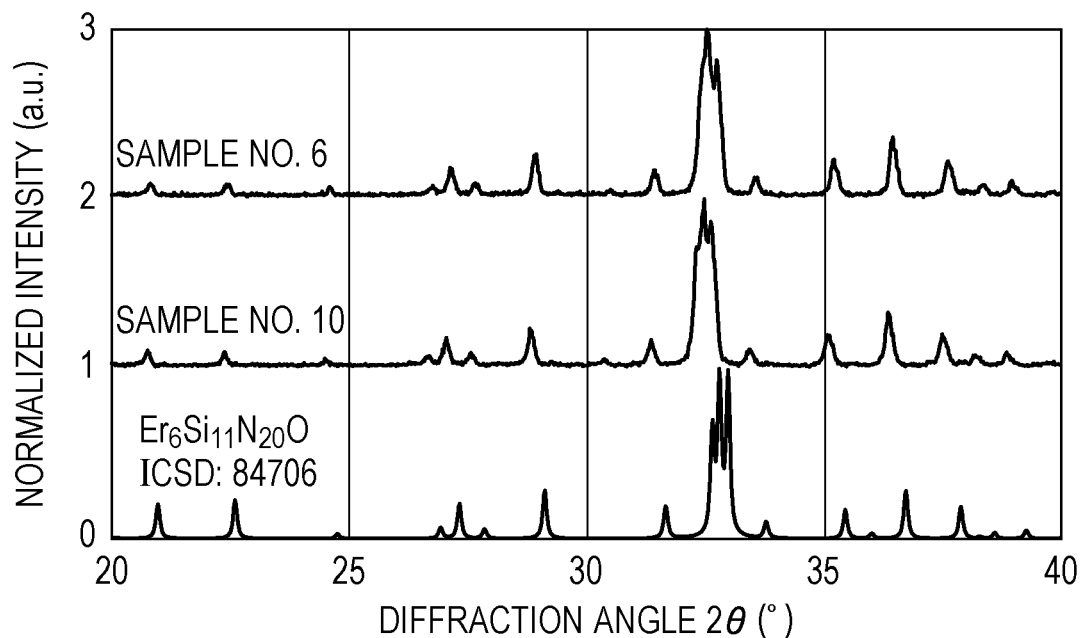
FIG. 28 is a powder XRD diffraction pattern diagram of the phosphors of sample Nos. 6 and 10.

Next, the Al substitution concentration will be discussed. As indicated in FIGS. 18 and 22 and Table 3, from the comparison between the phosphors of sample Nos. 6 and 10, it may be understood that the excitation peak wavelength is shifted to a shorter wavelength in a case where Si is substituted by Al. Accordingly, it may be understood that the Al substitution amount is changed and adjustment may thereby be performed such that the excitation peak wavelength matches the peak wavelength of the excitation light. Further, from the XRD pattern of the phosphor of sample No. 10, which is illustrated in FIG. 28, it may also be observed that a similar crystal system to the $Y_6Si_{11}N_{20}O$ crystal may be synthesized even in a case where compounding is performed such that the N amount is insufficient in the material powder.

Figure 23:
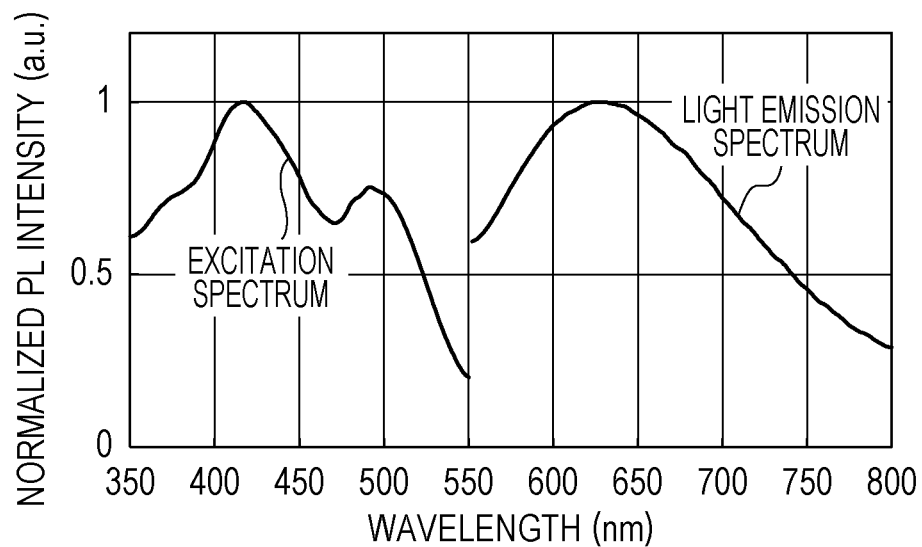
FIG. 23 is a diagram that illustrates the light emission spectrum and the excitation spectrum of the phosphor of sample No. 11.
Figure 24:
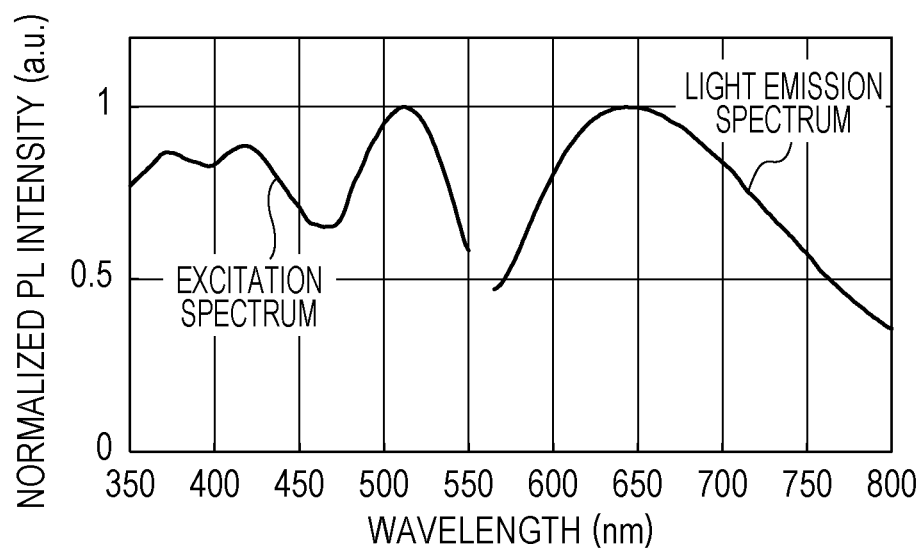
FIG. 24 is a diagram that illustrates the light emission spectrum and the excitation spectrum of the phosphor of sample No. 12.
Figure 25:
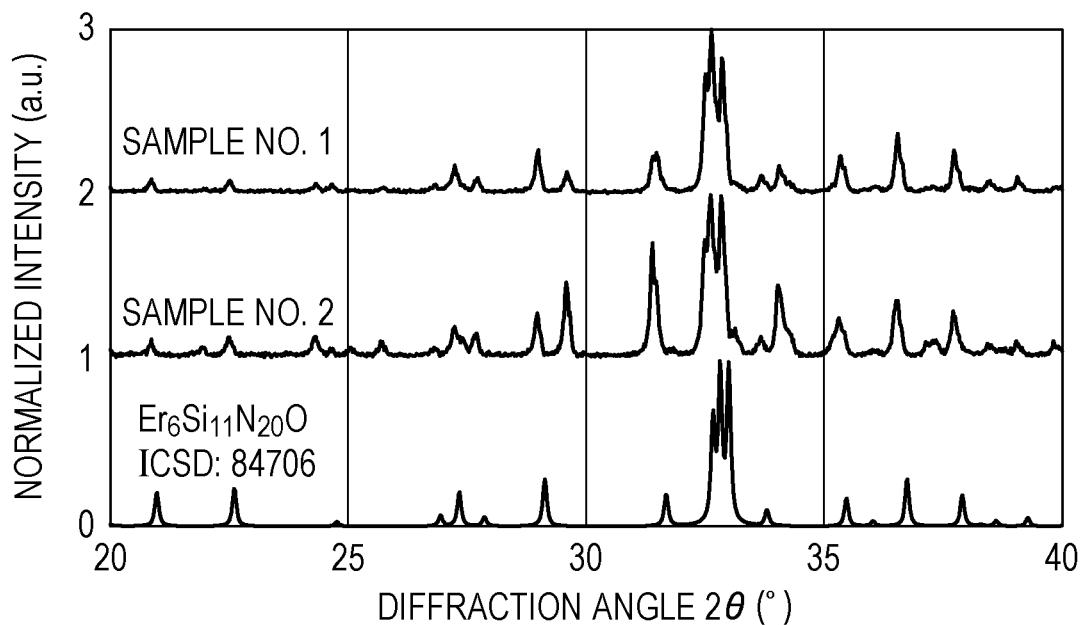
FIG. 25 is a powder XRD diffraction pattern diagram of the phosphors of sample Nos. 1 and 2.
Figure 26:
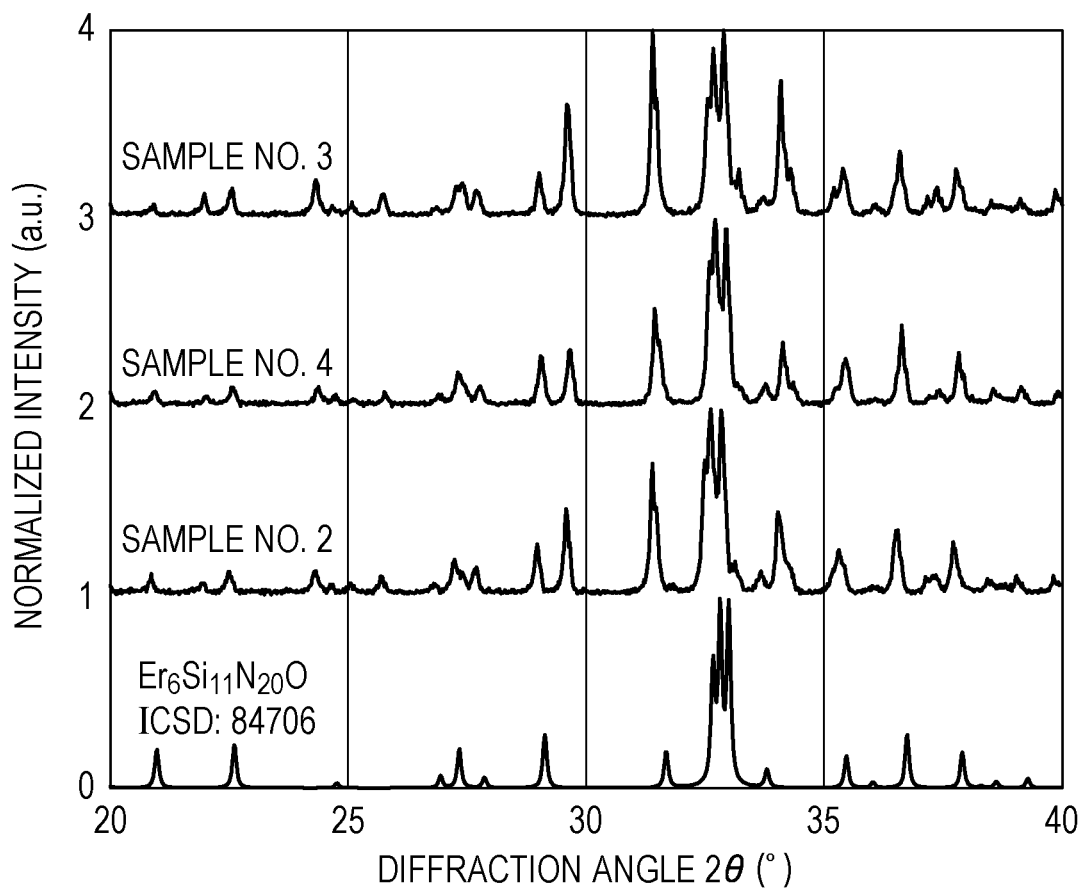
FIG. 26 is a powder XRD diffraction pattern diagram of the phosphors of sample Nos. 2 to 4.
Figure 27:
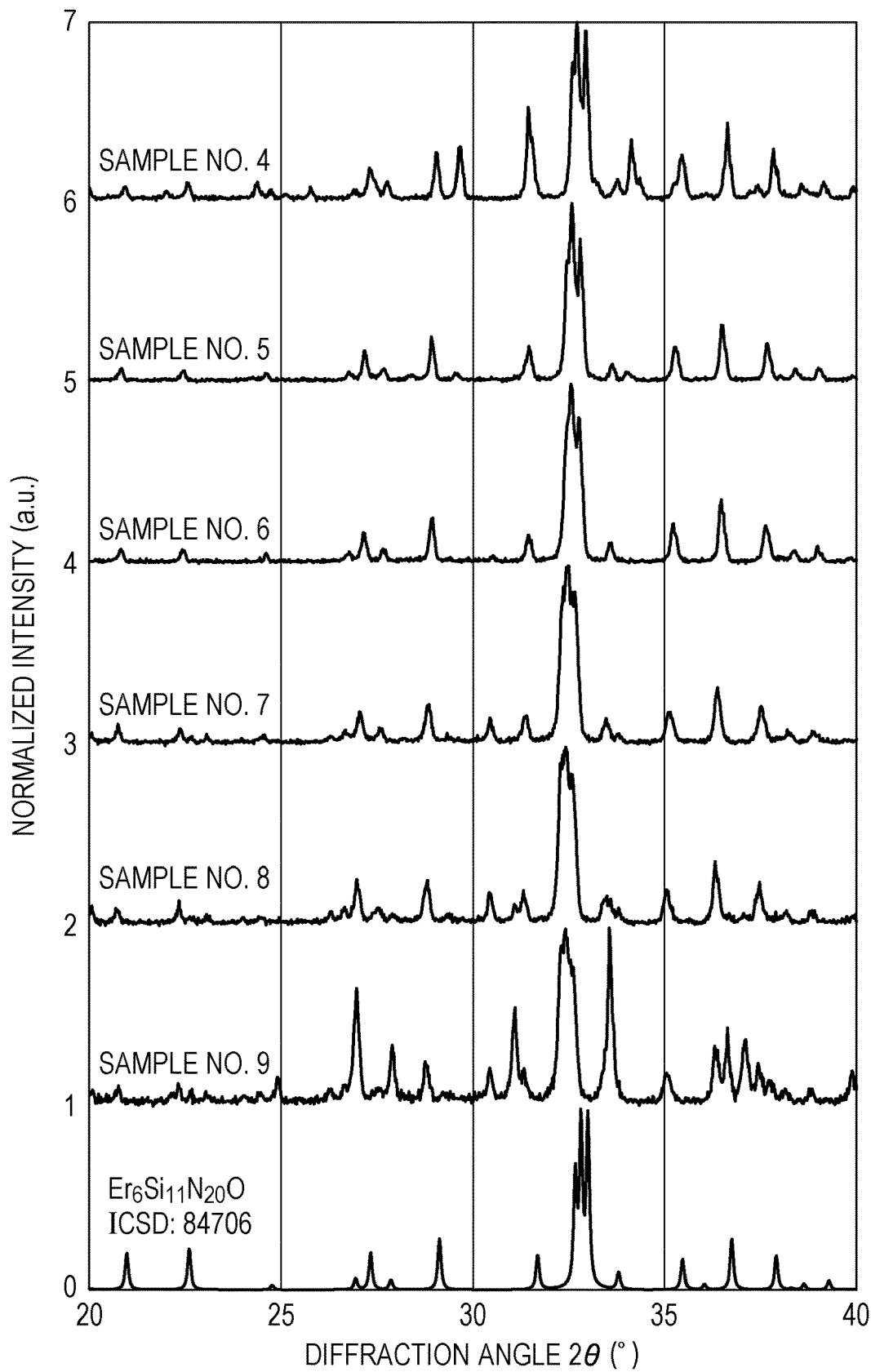
FIG. 27 is a powder XRD diffraction pattern diagram of the phosphors of sample Nos. 4 to 9.
Figure 29:
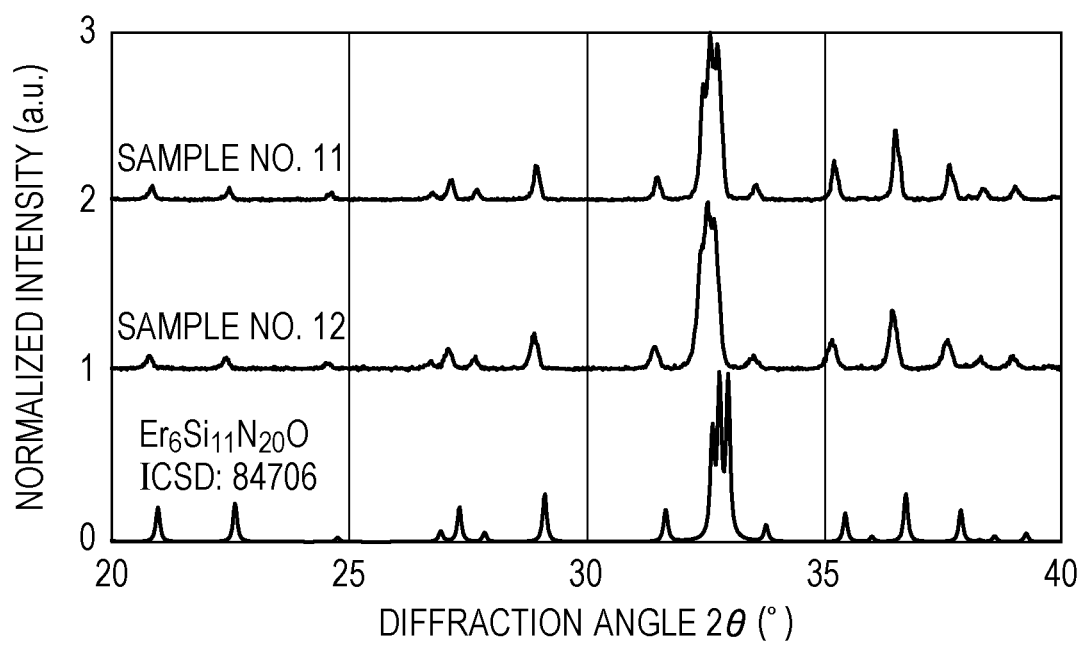
FIG. 29 is a powder XRD diffraction pattern diagram of the phosphors of sample Nos. 11 and 12.

Next, the synthesis of the phosphor without using an oxide material will be discussed. From the XRD patterns of the phosphors of sample Nos. 11 and 12, which are illustrated in FIG. 29, it was observed that a similar crystal system to the $Y_6Si_{11}N_{20}O$ crystal might be synthesized even in a case where an oxide was not used in the materials as indicated in Tables 2 and 3. It is considered that this is because nitride materials include approximately several mass % of oxygen. Further, as indicated in FIGS. 23 and 24 and Table 3, also as for the phosphors of sample Nos. 11 and 12, red light emission that had the light emission peak wavelengths in a wavelength range of not less than 600 nm and not more than 660 nm was observed, and further those phosphors had the excitation peak wavelengths at 480 nm or more.

The phosphor of the present disclosure is useful as a light emitting device or the like. The phosphor of the present disclosure may be used as a light source in a common illumination device such as a ceiling light, a special illumination device such as a spotlight, an illumination for a stadium, or an illumination for a studio, an illumination device for a vehicle such as a headlamp, a projection device such as a projector or a head-up display, a light for an endoscope, an image-capturing device such as a digital camera, a cellular phone, or a smartphone, a liquid crystal display device for a monitor for a personal computer (PC), a laptop personal computer, a television, a personal digital assistant (PDA), a smartphone, a tablet PC, or a cellular phone, or the like, for example.

What is claimed is:

1. A phosphor comprising:
   a crystal phase that has a chemical composition of $(Y_{1-x-y},Ce_x,La_y)_\alpha Si_{\beta-z}Al_z N_\gamma O$, where
   the α satisfies 5.5≤α≤6.5,
   the β satisfies 9.5≤β≤12.5,
   the γ satisfies 17.5≤γ≤22.5,
   the x satisfies 0<x≤0.1,
   the y satisfies 0≤y≤0.4, and
   the z satisfies 0≤z≤0.5, wherein
   a light emission spectrum of the phosphor includes a peak within a wavelength range of not less than 600 nm and not more than 660 nm.

2. The phosphor according to claim 1, wherein an excitation spectrum of the phosphor includes a first peak within a wavelength range of not less than 470 nm and not more than 550 nm.

3. The phosphor according to claim 2, wherein
   the excitation spectrum includes the first peak within a wavelength range of not less than 480 nm and not more than 550 nm.

4. The phosphor according to claim 2, wherein
   the excitation spectrum further includes a second peak within a wavelength range of not less than 350 nm and less than 470 nm.

5. The phosphor according to claim 1, wherein the y satisfies 0<y≤0.3.

6. The phosphor according to claim 1, wherein a 1/e light emission lifetime of the crystal phase is 100 ns or less.

7. The phosphor according to claim 6, wherein the 1/e light emission lifetime of the crystal phase is 50 ns or less.

8. The phosphor according to claim 1, wherein a full width at half maximum of the peak of the light emission spectrum is 100 nm or more.

9. The phosphor according to claim 8, wherein the full width at half maximum of the peak of the light emission spectrum is 150 nm or more.

10. A light emitting device comprising:
an excitation light source that emits light at a wavelength of 600 nm or less; and
a first phosphor that is irradiated with the light which is emitted by the excitation light source and that emits fluorescence at a longer wavelength than the light, wherein
the first phosphor includes a crystal phase that has a chemical composition of $(Y_{1-x-y},Ce_x,La_y)_\alpha Si_{\beta-z}Al_zN_\gamma O$, where
the $\alpha$ satisfies $5.5 \leq \alpha \leq 6.5$,
the $\beta$ satisfies $9.5 \leq \beta \leq 12.5$,
the $\gamma$ satisfies $17.5 \leq \gamma \leq 22.5$,
the x satisfies $0 < x \leq 0.1$,
the y satisfies $0 < y \leq 0.4$, and
the z satisfies $0 \leq z \leq 0.5$, wherein
a light emission spectrum of the first phosphor includes a peak within a wavelength range of not less than 600 nm and not more than 660 nm.

11. The light emitting device according to claim 10, wherein
the light that is emitted by the excitation light source is light at a wavelength of not less than 480 nm and not more than 600 nm.

12. The light emitting device according to claim 10, wherein
the light that is emitted by the excitation light source is light at a wavelength of not less than 420 nm and not more than 480 nm.

13. The light emitting device according to claim 10, wherein the excitation light source is an LED or an LD.

14. The light emitting device according to claim 10, further comprising:
a second phosphor that is irradiated with the light which is emitted by the excitation light source and that emits fluorescence at a longer wavelength than the light, wherein
a light emission spectrum of the second phosphor includes a peak within a wavelength range of not less than 480 nm and less than 600 nm.

15. The light emitting device according to claim 14, further comprising:
a third phosphor that is irradiated with the light which is emitted by the excitation light source and that emits fluorescence at a longer wavelength than the light, wherein
the fluorescence of the third phosphor is green light, and
the fluorescence of the second phosphor is yellow light.

16. The light emitting device according to claim 10, wherein
the light emitted by the excitation light source includes green light and blue light,
the green light has a peak wavelength within a wavelength range of not less than 480 nm and not more than 550 nm, and
the blue light has a peak wavelength within a wavelength range of not less than 430 nm and not more than 470 nm.

17. The light emitting device according to claim 16, wherein
the excitation light source includes: a GaN-based semiconductor laser device that emits the blue light; and a solid YAG:Nd laser device that emits the green light and that includes a second harmonic generator.

18. The light emitting device according to claim 10, wherein
the y satisfies $0 < y \leq 0.3$.

* * * * *